(12) United States Patent
Ackaret et al.

(10) Patent No.: US 9,003,223 B2
(45) Date of Patent: Apr. 7, 2015

(54) PHYSICAL MEMORY FAULT MITIGATION IN A COMPUTING ENVIRONMENT

(71) Applicant: International Business Machines Corporation, Armonk, NY (US)

(72) Inventors: Jerry D. Ackaret, Beaverton, OR (US); Robert M. Dunn, Hyde Park, NY (US); Susan E. Goodwin, Edmonds, WA (US); Sumeet Kochar, Apex, NC (US); Randolph S. Kolvick, Durham, NC (US); James A. O'Connor, Ulster Park, NY (US); Wilson E. Smith, Bahama, NC (US); Jeffery J. Van Heuklon, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 13/628,130

(22) Filed: Sep. 27, 2012

(65) Prior Publication Data

US 2014/0089725 A1    Mar. 27, 2014

(51) Int. Cl.
*G06F 11/00* (2006.01)
*G06F 11/07* (2006.01)
*G06F 12/06* (2006.01)

(52) U.S. Cl.
CPC .......... *G06F 12/0653* (2013.01); *G06F 11/073* (2013.01); *G06F 11/0793* (2013.01)

(58) Field of Classification Search
CPC ............ G06F 11/2017; G06F 11/3037; G06F 11/1482; G06F 11/2043; G06F 11/2046; G11C 29/54; G11B 20/1883
USPC ................ 714/6.1, 6.12, 6.13, 6.2, 42, 54, 31
See application file for complete search history.

(56) References Cited

U.S. PATENT DOCUMENTS

| | | | |
|---|---|---|---|
| 5,101,492 A * | 3/1992 | Schultz et al. | 714/6.32 |
| 5,649,139 A | 7/1997 | Weinreb et al. | |
| 5,708,791 A | 1/1998 | Davis et al. | |
| 6,892,383 B1 * | 5/2005 | Arndt | 718/1 |
| 7,197,613 B2 | 3/2007 | Shibuya et al. | |
| 7,882,319 B2 * | 2/2011 | Johnson et al. | 711/165 |
| 8,006,123 B2 | 8/2011 | Yamamoto et al. | |
| 8,689,041 B2 * | 4/2014 | Lu | 714/6.13 |
| 2003/0126327 A1 | 7/2003 | Pesola et al. | |

(Continued)

OTHER PUBLICATIONS

Zhu, J. et al., "Improving the Performance of Hypervisor-Based Fault Tolerance," 2010 IEEE International Symposium on Parallel & Distributed Processing (IPDPS), pp. 1-10, doi: 10.1109/IPDPS.2010,5470357.

*Primary Examiner* — Scott Baderman
(74) *Attorney, Agent, or Firm* — Robert R. Williams, Esq.; Blanche E. Schiller, Esq.; Heslin Rothenberg Farley & Mesiti P.C.

(57) ABSTRACT

Effects of a physical memory fault are mitigated. In one example, to facilitate mitigation, memory is allocated to processing entities of a computing environment, such as applications, operating systems, or virtual machines, in a manner that minimizes impact to the computing environment in the event of a memory failure. Allocation includes using memory structure information, including, information regarding fault containment zones, to allocate memory to the processing entities. By allocating memory based on fault containment zones, a fault only affects a minimum number of processing entities.

19 Claims, 16 Drawing Sheets

(56) References Cited

U.S. PATENT DOCUMENTS

| | | |
|---|---|---|
| 2006/0236165 A1* | 10/2006 | Cepulis et al. .............. 714/721 |
| 2007/0061612 A1* | 3/2007 | Henderson et al. ............ 714/5 |
| 2009/0024820 A1* | 1/2009 | Ponnuswamy .............. 711/170 |
| 2009/0157959 A1 | 6/2009 | Miyazaki |
| 2009/0248949 A1* | 10/2009 | Khatri et al. .................... 711/6 |
| 2009/0282210 A1* | 11/2009 | Heyrman et al. ............. 711/173 |
| 2009/0287957 A1* | 11/2009 | Bilger et al. ...................... 714/8 |
| 2009/0300413 A1* | 12/2009 | Chang et al. ...................... 714/8 |
| 2009/0307538 A1* | 12/2009 | Hernandez et al. ............. 714/54 |
| 2010/0037097 A1* | 2/2010 | Kobayashi et al. ............. 714/19 |
| 2011/0283135 A1 | 11/2011 | Burger et al. |
| 2012/0159116 A1* | 6/2012 | Lim et al. ...................... 711/206 |
| 2014/0040576 A1* | 2/2014 | Cordero et al. ............... 711/162 |

\* cited by examiner

| PAZ TABLE | STARTING ADDRESS 402 | ENDING ADDRESS 404 | PAZ LEVEL 2 406 | POWER ZONE 408 | PERFORMANCE ZONE 410 | CURRENT STATE INFO 412 | |
|---|---|---|---|---|---|---|---|
| MIN PAZ # | | | | | | | |
| PAZ(0) | XXXXXXXX | YYYYYYYY | PAZ(0) | PWR(0) | PER(0) | ... | |
| PAZ(1) | | | PAZ(0) | PWR(0) | PER(0) | | |
| PAZ(2) | | | PAZ(0) | PWR(0) | PER(0) | | |
| ... | | | | | | | |
| PAZ(7) | | | PAZ(0) | PWR(0) | PER(0) | | |
| PAZ(8) | | | PAZ(0) | PWR(0) | PER(0) | | |
| PAZ(9) | | | PAZ(N/8) | PWR(J) | PER(1) | | |
| PAZ(N-8) | | | PAZ(N/8) | PWR(J) | PER(N-8) | | |
| PAZ(N) | | | | PWR(J) | PER(N) | | |

FIG. 4

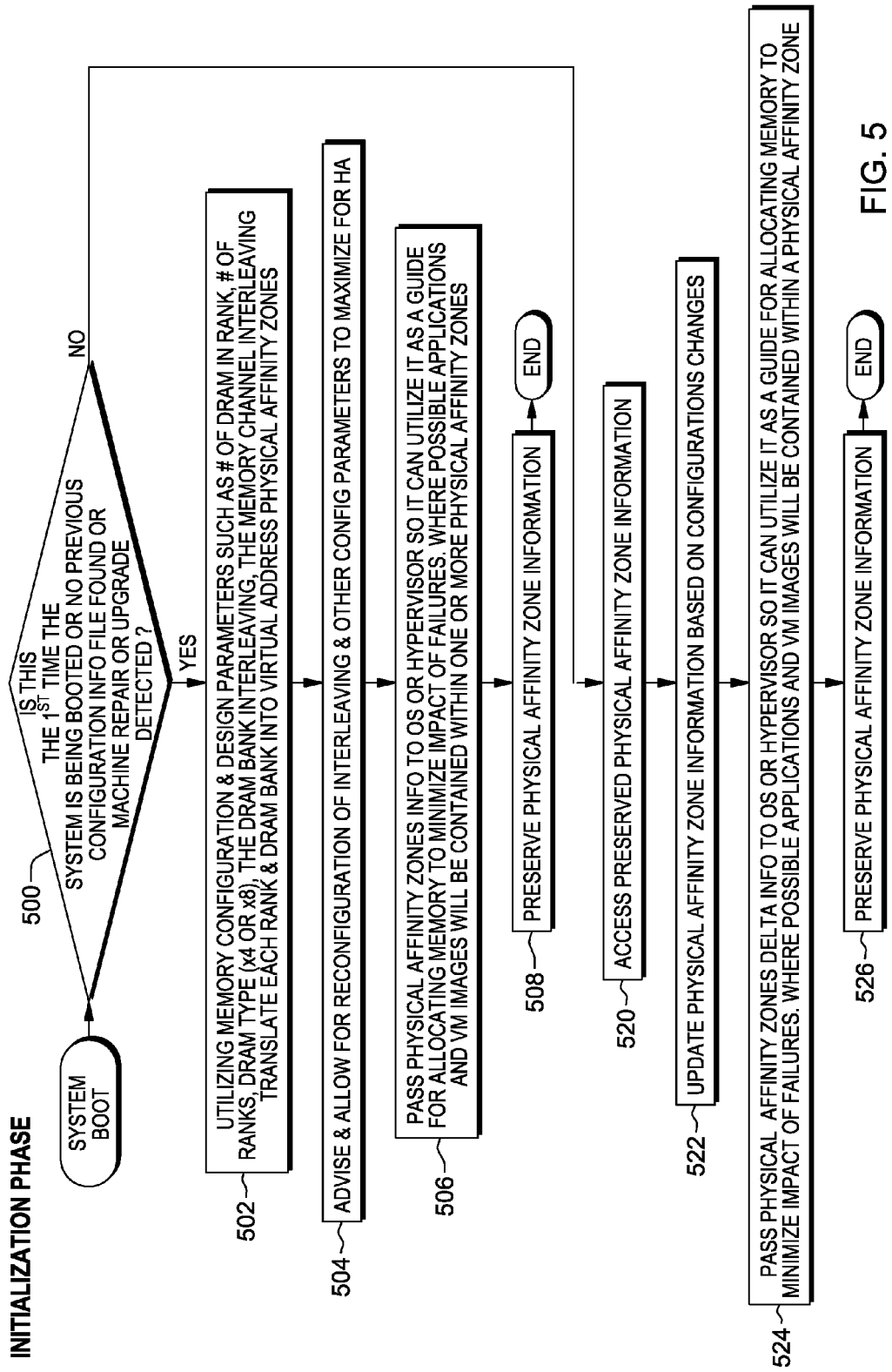

16 GB TOTAL WITH 1 DIMM PER CHANNEL

| TOTAL 16 GB | | SINGLE RANK 2 GB DIMMs | |
|---|---|---|---|
| x8 | | x4 | |
| BANK FAILURE | DRAM FAILURE | BANK FAILURE | DRAM FAILURE |
| 1 | 0.2% | 1.56% | 0.4% | 3.2% |
| 2 | 0.4% | 3.13% | 0.8% | 6.4% |
| 4 | 0.8% | 6.25% | 1.6% | 12.8% |

FIG. 12A

48 GB TOTAL WITH 3 DIMMs PER CHANNEL

| TOTAL 48 GB | | SINGLE RANK 2 GB DIMMs | |
|---|---|---|---|
| x8 | | x4 | |
| BANK FAILURE | DRAM FAILURE | BANK FAILURE | DRAM FAILURE |
| 1 | 0.07% | 0.52% | 0.13% | 1.07% |
| 2 | 0.13% | 1.04% | 0.27% | 2.13% |
| 4 | 0.27% | 2.08% | 0.53% | 4.27% |

32 GB TOTAL WITH 1 DIMM PER CHANNEL

| TOTAL 32 GB | | | DUAL RANK 4 GB DIMMs | |
|---|---|---|---|---|
| | x8 | | x4 | |
| | BANK FAILURE | DRAM FAILURE | BANK FAILURE | DRAM FAILURE |
| 1 | 0.1% | 0.78% | 0.2% | 1.6% |
| 2 | 0.2% | 1.56% | 0.4% | 3.2% |
| 4 | 0.4% | 3.13% | 0.8% | 6.4% |

FIG. 12D

96 GB TOTAL WITH 1 DIMM PER CHANNEL

| TOTAL 96 GB | | | DUAL RANK 4 GB DIMMs | |
|---|---|---|---|---|
| | x8 | | x4 | |
| | BANK FAILURE | DRAM FAILURE | BANK FAILURE | DRAM FAILURE |
| 1 | 0.03% | 0.26% | 0.07% | 0.53% |
| 2 | 0.07% | 0.52% | 0.13% | 1.07% |
| 4 | 0.13% | 1.04% | 0.27% | 2.13% |

64 GB TOTAL WITH 1 DIMM PER CHANNEL

| TOTAL 64 GB | | | QUAD RANK 8 GB DIMMs | | |
|---|---|---|---|---|---|
| x8 | | | x4 | | |
| | BANK FAILURE | DRAM FAILURE | | BANK FAILURE | DRAM FAILURE |
| 1 | 0.05% | 0.4% | | 0.1% | 0.8% |
| 2 | 0.1% | 0.8% | | 0.2% | 1.6% |
| 4 | 0.2% | 1.6% | | 0.4% | 3.2% |

FIG. 12E

192 GB TOTAL WITH 1 DIMM PER CHANNEL

| TOTAL 192 GB | | | QUAD RANK 8 GB DIMMs | | |
|---|---|---|---|---|---|
| x8 | | | x4 | | |
| | BANK FAILURE | DRAM FAILURE | | BANK FAILURE | DRAM FAILURE |
| 1 | 0.02% | 0.13% | | 0.03% | 0.27% |
| 2 | 0.03% | 0.27% | | 0.07% | 0.53% |
| 4 | 0.07% | 0.53% | | 0.13% | 1.07% |

FIG. 12F

PHYSICAL MEMORY FAULT MITIGATION IN A COMPUTING ENVIRONMENT

BACKGROUND

One or more aspects of the invention relate, in general, to computer memory, and in particular, to managing computer memory to mitigate effects of a fault of the computer memory.

Computer systems often require a considerable amount of high speed memory, such as random access memory (RAM), to hold information, including operating system software, virtual machine images, application programs and other data, while a computer is powered on and operational. This information is normally binary, composed of patterns of 1's and 0's, known as bits of data. This binary information is typically loaded into RAM from nonvolatile storage, such as hard disk drives (HDD), during power on and initial program load (IPL) of the computer system.

Computer RAM is often designed with pluggable modules so that incremental amounts can be added to each computer as dictated by the specific memory requirements for each system and application. One example of such a pluggable module is the Dual In-Line Memory Module (DIMM), which is a thin rectangular card with several memory chips mounted on the card. DIMMs are often designed with dynamic random access memory (DRAM) chips that are to be regularly refreshed to prevent the data they are holding from being lost. Originally, DRAM chips were asynchronous devices, but newer chips, SDRAM (synchronous dynamic random access memory), have synchronous interfaces to improve performance. Eventually, Double Data Rate (DDR) devices surfaced that use pre-fetching, along with other speed enhancements, to improve memory bandwidth and reduce latency.

The size of RAM has continued to grow as computer systems have become more powerful. Currently, it is not uncommon to have a single computer RAM composed of hundreds of trillions of bits. The failure of just a single RAM bit can cause the entire computer system to fail. When hard errors occur, either single cell, multi-bit, full chip or full DIMM failures, all or part of the system RAM may remain down until it is repaired. This can be hours or even days, which can have a substantial impact on a business dependent on the computer system.

BRIEF SUMMARY

Shortcomings of the prior art are overcome and advantages are provided through the provision of a method of managing memory of a computing environment. The method includes, for instance, obtaining, by a controller executing on a processor of the computing environment, memory structure information to be used in allocating memory to a plurality of processing entities of the computing environment, the memory structure information including information relating to a plurality of address ranges provided based on memory structure and based on one or more types of potential physical memory failures corresponding to the memory structure; and assigning, by the controller, based on at least a portion of the memory structure information, at least one address range of the plurality of address ranges to at least one processing entity of the plurality of processing entities, the assigning reducing an effect of a memory fault on the computing environment, wherein based on the allocating the memory fault is limited to a subset of processing entities of the plurality of processing entities.

Systems and computer program products relating to one or more aspects of the present invention are also described and claimed herein. Further, services relating to one or more aspects of the present invention are also described and may be claimed herein.

Additional features and advantages are realized through the techniques of aspects of the present invention. Embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and objects, features, and advantages of one or more aspects of the invention are apparent from the following detailed description taken in conjunction with the accompanying drawings in which:

FIG. 4 depicts one example of a table of physical affinity zones created in accordance with an aspect of the present invention;

FIG. 5 depicts one embodiment of the logic associated with an initialization phase in which physical affinity zones are created, in accordance with an aspect of the present invention;

FIGS. 12A-12F depict examples of contiguous software accessible memory spaces impacted by bank and DRAM failures.

DETAILED DESCRIPTION

Figure 1A:
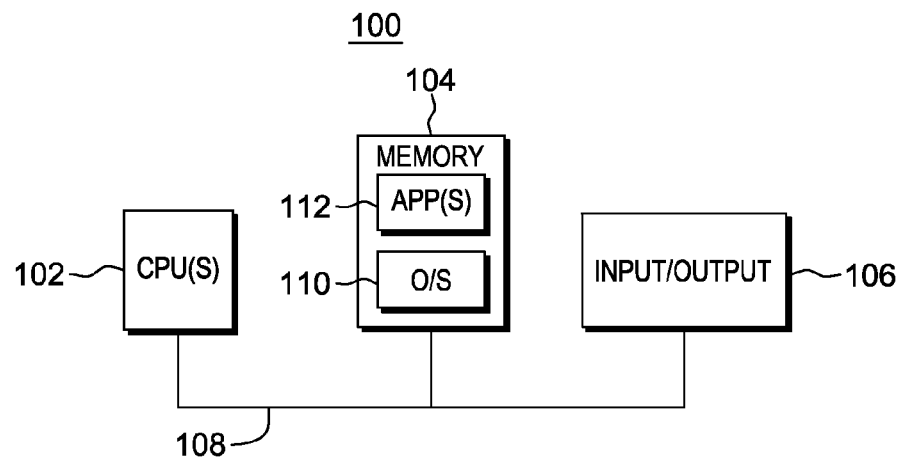
FIG. 1A depicts one embodiment of a computing environment to incorporate and use one or more aspects of the present invention.

The probability of encountering a memory failure during normal computer operations has continued to increase as the size of computer RAM has continued to grow. Simply put, with all else equal, the greater the total size of RAM, the more components and parts are needed to craft the memory system, the higher the failure rate, and thus, the more likely a fault will be encountered during the operating life of the computer system.

Techniques to detect and correct memory bit errors have evolved into an elaborate science over the past several decades. Perhaps the most basic detection technique is the generation of odd or even parity where the number of 1's or 0's in a data word are XOR-ed together to produce a parity bit. For example, a data word with an even number of 1's has a parity bit of 0, and a data word with an odd number of 1's has a parity bit of 1. If there is a single error produced in the data word, it can be detected by regenerating parity from the data and then checking to see that it matches the originally generated parity.

Parity techniques have also been extended to correct errors. Richard Hamming recognized that parity could be extended to correct errors by appending an XOR field, an error correcting code (ECC) field, to each code word. The ECC field is a combination of different bits in the word XOR-ed together so that errors (small changes to the data word) can be easily detected, pinpointed and corrected. The number of errors that can be detected and corrected are directly related to the length and the number of bits or symbols in the error correcting code field appended to the data word. However, a minimum separation distance is to be included between valid data words and code word combinations. The greater the number of errors to be detected and corrected, the longer the code word, thus creating a greater distance between valid code words. This distance between valid code words is known as the Hamming Distance.

Memory error correcting codes, like those proposed by Hamming, utilize a combination of parity codes in various bit positions of the data word to allow detection and correction of errors. Every time a data word is written into memory, a new code word or checksum is generated and stored with the data allowing detection and correction of the data if, when the data is read out of memory, the ECC does not match that which is stored.

One type of ECC code is a Binary ECC code that allows for Double-bit Error Detection (DED) and Single-bit Error Correction (SEC). This DED/SEC ECC also allows for transparent recovery of single bit hard errors in RAM.

Further, to help reduce the impact of soft memory errors, scrubbing routines are used to locate memory errors and then recover from the soft errors through a compliment/re-compliment process. Scrubbing can also be used to detect hard memory errors before they are encountered directly by the operating system or application software.

Additionally, to address relatively minor physical memory faults, some server developers utilize a technique, commonly referred to as page retirement, which is effective in dealing with relatively minor physical memory faults, thus, improving computer system availability. When a minor fault is detected in memory, the page is made unavailable to the software and no longer used. Relatively small sections of memory space, associated with minor physical memory faults, are retired and not used during normal computer operation.

Page retirement is most effective if the fault is detected before it is encountered directly by the operating system or application software, but that is not always possible. Memory faults may be encountered during normal operation, as well as during memory scrubbing, where the memory space is independently scanned to look for data errors. If the memory fault is minor and is detected during scrubbing, then the affected portion of memory can be retired with little or no impact to system operation.

If, however, the memory space is being used by the operating system or application software, preventing a system crash is still possible, but more involved. For example, it may be possible to terminate, restart or relocate an application or virtual machine image without impacting the rest of the software running on the system, if the scope of memory affected by the fault is limited to a single or small number of applications or virtual machine images.

Page retirement is ineffective in containing more serious memory failures because the failure signatures of those faults encompass a memory space far larger than the space associated with a single page. Memory pages are most often a few thousand bytes, typically in the 2 k or 4 k byte range. A more serious memory failure may span tens of thousands of memory pages and not all pages will necessarily be associated with a single application, single virtual machine image or single operating system image. Contiguous addresses in the memory space (e.g., virtual memory space) used by system applications and operating systems map in complex ways to noncontiguous addresses in physical memory due to interleaving and memory system design where a single memory word line, a single cache line, may span multiple memory channels. It would be impractical to detect each instance of the failure on each page one at a time, and then one-by-one, individually retire each page. Individually relocating thousands of memory pages associated with different operating system images and application software brings a server to its knees.

Even DRAM failures associated with only a DRAM bank, and not the entire DRAM chip, encompass a much larger portion of memory than can be effectively avoided via page retirement. DRAM chips have continued to grow denser over time being able to store a greater number of bits each generation. Take, for example, a common DRAM chip able to store 2 Gigabytes. It would be impractical to one-by-one retire 4k pages until this entire space was mapped eliminating all manifestations of this error in one's memory space. That would represent 64,000 individual pages being retired. Page retirement in an active system involves the operating system relocating data or applications utilizing the space to an alternate space in memory and then flagging the page as unavailable. Having to take that action on 64,000 individual pages as each page error is encountered is impractical.

Additionally, memory faults associated with a hypervisor controlling virtual machines running on a server can have a far more significant overall system impact possibly resulting in a system crash. It may not be possible to mitigate these via page retirement or other recovery techniques.

RAM error correction has challenges in that it is difficult to pinpoint data faults. Although there is a need to improve computer RAM availability with even more advanced error correction techniques, attempts to do this have been hampered by how much customer usable storage remains. Using redundancy through extra copies of data or more sophisticated coding techniques drives up costs and adds complexity to the design. For example, the simple approach of memory mirroring, RAID-1, has been offered as a feature by several companies, including on System x servers offered by International Business Machines Corporation (IBM®). It is capable of surviving more catastrophic memory failures, but it requires a doubling of the memory size on top of the base SEC/DED error correcting codes already present in the design which leaves customers with less than 50% of the RAM available.

The System z mainframe servers, offered by International Business Machines Corporation, are known for providing extremely high availability and lead the way in innovation. System z servers provide as a standard feature on every server an innovative advance RAID-like memory architecture, known as RAIM, that can survive both a full DIMM failure and even a full memory channel failure continuing to run unimpaired. This design provides high availability.

Nevertheless, servers crafted with industry standard DIMMs often have error correcting code schemes that are far less robust and effective when compared to IBM® System z mainframes and other systems offered by International Business Machines Corporation, such as System p servers. Specialized high availability memory system designs are not always practical for lower cost servers. The industry desires better high availability memory solutions for lower cost servers, such as the x86 type servers, constructed with lower cost industry standard hardware and industry standard operating systems. (IBM, SYSTEM X, SYSTEM Z and SYSTEM P are registered trademarks of International Business Machines Corporation, Armonk, N.Y. Other names used herein may be registered trademarks, trademarks or product names of International Business Machines Corporation or other companies.)

Additionally, the proliferation of virtualization running on industry standard servers has resulted in configuring the servers with much larger memory, sized in order to accommodate relatively large numbers of operating system images running on a single server. A memory failure in this environment can cause the entire system to crash.

In accordance with an aspect of the present invention, effects of a physical memory fault are mitigated. In one example, to facilitate mitigation, memory is allocated to processing entities of a computing environment, such as applications, operating systems, or virtual machines, in a manner that minimizes impact to the computing environment in the event of memory failure. Allocation includes using memory structure information, including, for instance, information regarding fault containment zones, to allocate memory to the processing entities. By allocating memory based on fault containment zones, a fault only affects a minimum number of processing entities.

The memory structure information, in one embodiment, is obtained and used by a controller to allocate the memory. The controller is, for instance, an operating system or a hypervisor, depending on the environment and the entity to which memory is being allocated.

In one aspect, a capability, referred to herein as physical memory fault mitigation via minimally expansive virtual memory pruning, is provided that first identifies and quantifies the full scope of a physical memory fault. It then translates the physical memory space associated with the fault by mapping it directly to the minimum affected virtual memory, the software-recognizable address space. This capability is effective not only for minor faults that might lend themselves to traditional page retirement techniques, but is also effective for physical memory faults spanning thousands of noncontiguous memory pages. Using this targeted-surgical memory space pruning mechanism, loss of usable memory space to the operating system, virtual machines, and/or applications is kept to a minimum, while still preventing use of the physical memory space associated with the fault.

The terms, physical address and virtual address, are used herein. In computing, a physical address (also referred to as a real address or binary address) is a memory address that is represented, e.g., in the form of a binary number on the address bus circuitry in order to enable the data bus to access a particular storage cell of main memory. In a computer with virtual memory, the term physical address is used mostly to differentiate from a virtual address. In particular, in computers utilizing translation of memory addresses, the virtual and physical addresses refer to an address after and before translation, respectively.

One embodiment of a computing environment to incorporate and use one or more aspects of the present invention is depicted in FIG. 1A. As shown, in one example, a computing environment 100 includes one or more processors (e.g., central processing units) 102, a memory 104, and one or more input/output devices or interfaces 106 coupled to one another via one or more buses or other connections 108. The memory includes at least one controller (e.g., operating system 110) and one or more processing entities (e.g., applications 112) to be executed by one or more of processors 102.

Figure 1B:
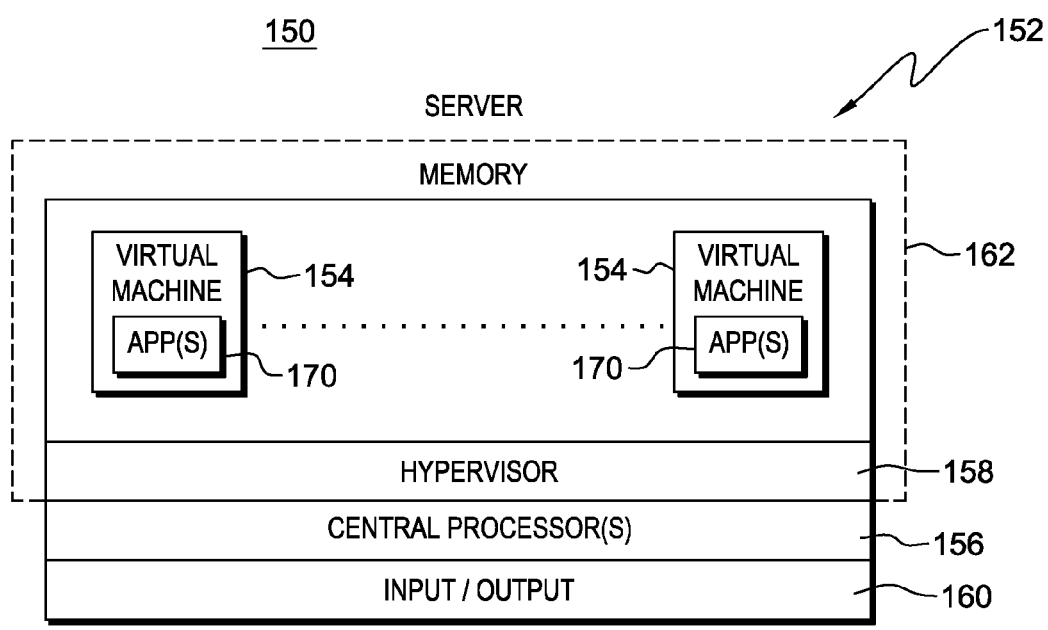
FIG. 1B depicts another embodiment of a computing environment to incorporate and use one or more aspects of the present invention.

A further embodiment of a computing environment to incorporate and use one or more aspects of the present invention is depicted in FIG. 1B. In this example, a computing environment 150 includes a server 152 that includes, for instance, one or more processing entities (e.g., virtual machines 154), one or more central processors 156, at least one controller (e.g., hypervisor 158), and an input/output subsystem 160. The virtual machines and hypervisor are included in memory 162.

In this embodiment, each virtual machine is capable of hosting a guest operating system (not shown) and may be executing one or more applications 170. An operating system or application running in a virtual machine appears to have access to a full complete system, but in reality, only a portion of it is available.

Central processors 156 are physical processor resources that are assignable to a virtual machine. For instance, virtual machine 154 includes one or more logical processors, each of which represents all or a share of a physical processor 156 that may be dynamically allocated to the virtual machine. Virtual machines 154 are managed by hypervisor 158, such as PowerVM, offered by International Business Machines Corporation, or VMware, as examples.

Input/output subsystem 160 directs the flow of information between devices and memory (also referred to herein as main storage). It is coupled to the server in that it can be part of the server or separate therefrom. The I/O subsystem relieves the central processors of the task of communicating directly with the I/O devices coupled to the server and permits data processing to proceed concurrently with I/O processing.

Figure 2:
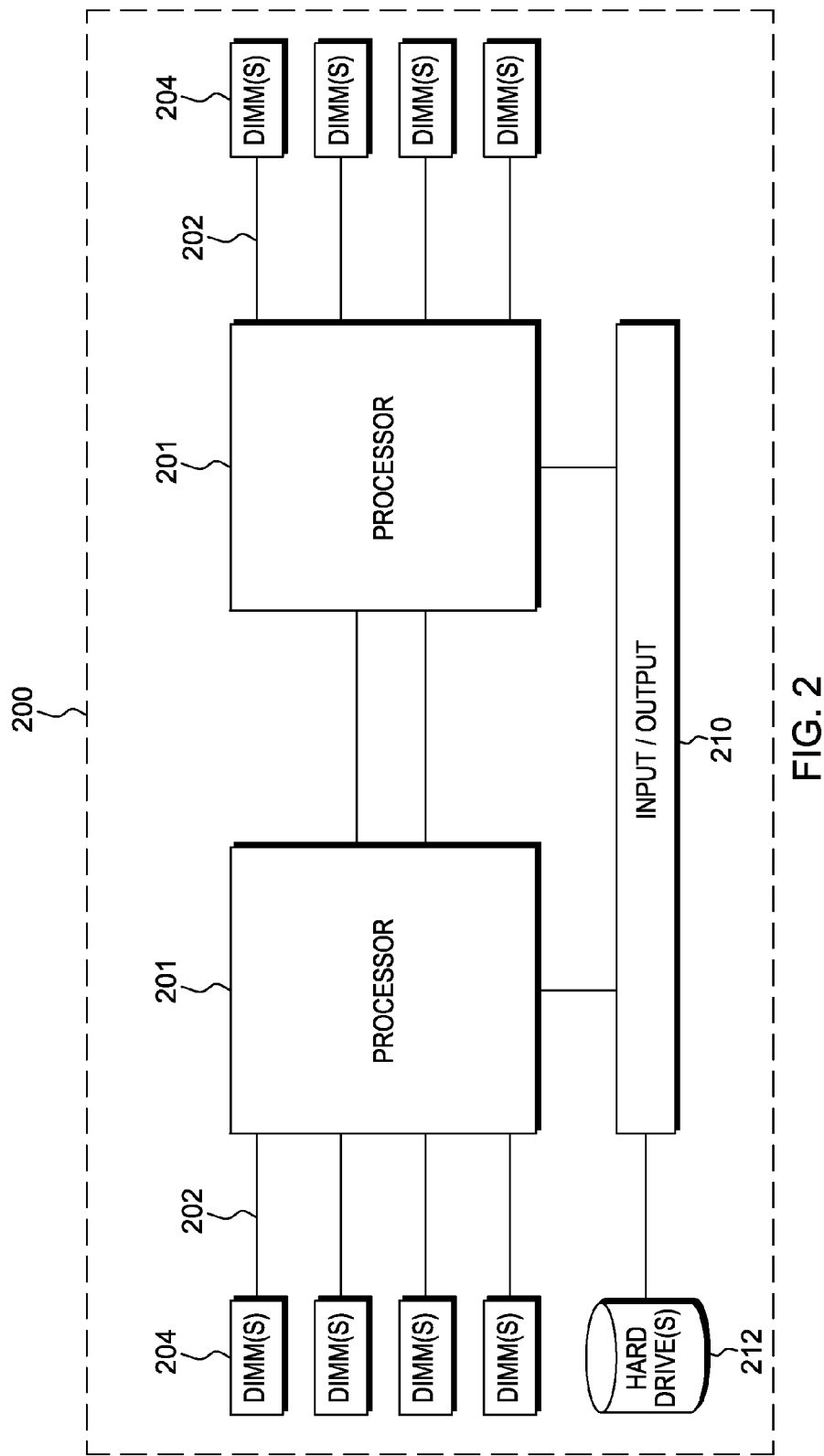
FIG. 2 depicts further details of a computing environment to incorporate and use one or more aspects of the present invention.

Further details regarding processors and memory associated therewith are described with reference to FIG. 2. In one example, a server 200, such as a System x server offered by International Business Machines Corporation, includes at least two processors 201, such as x86 processors. Each processor has associated therewith four memory channels 202, and each memory channel has associated therewith one or more memory modules 204, such as dual in-line memory modules (DIMMs). In this example, each memory channel has up to three DIMMs; but, in other embodiments, a channel may have more or less modules, and one channel may have a different number of modules than another channel. Further, each processor may have more or less channels than described in this example, and the number of channels for one processor can be the same or different than another processor. The processors are coupled to input/output subsystem 210, which is coupled to one or more hard drives 212.

Figure 3:
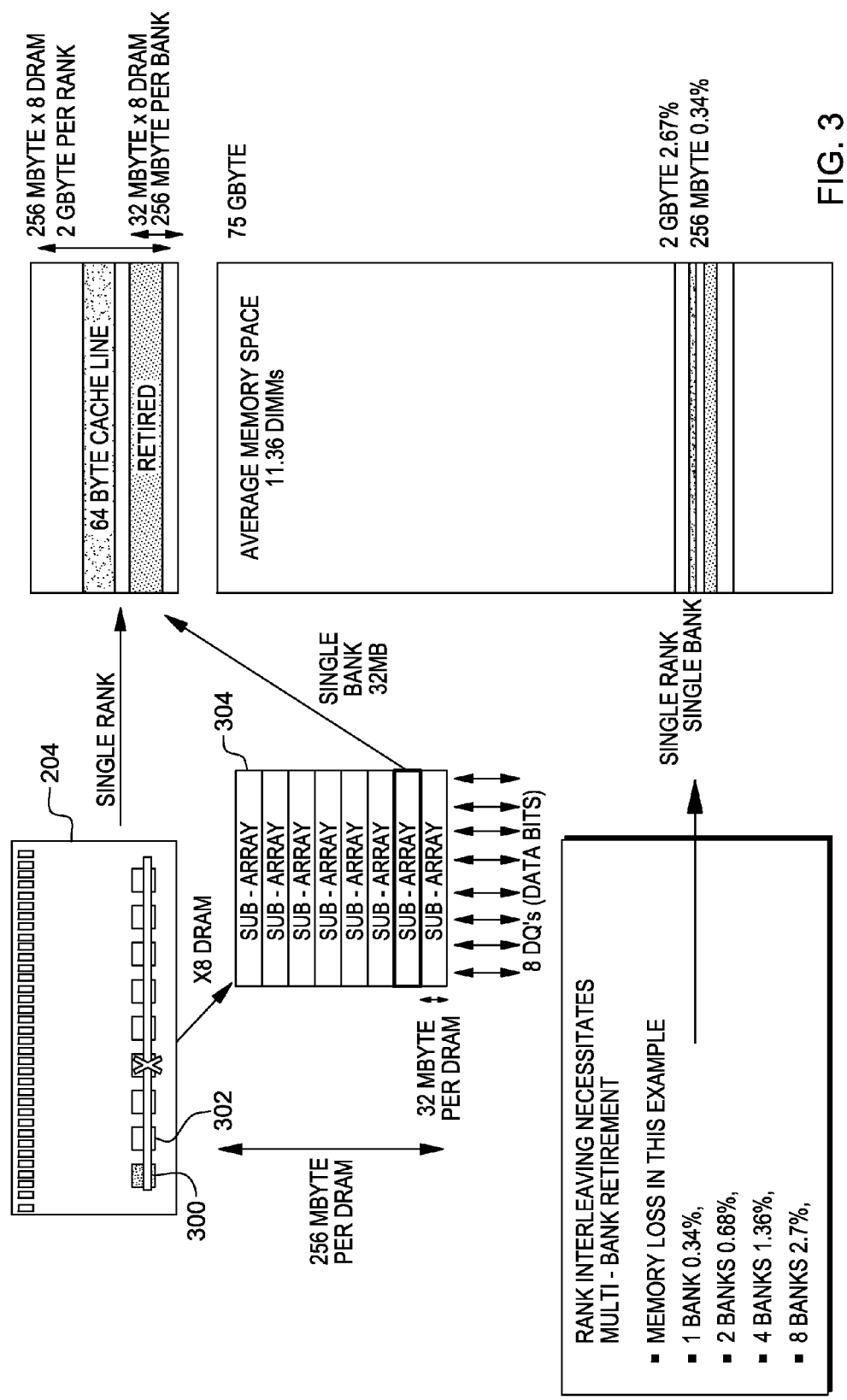
FIG. 3 depicts further details associated with memory of a computing environment to incorporate and use one or more aspects of the present invention.

In one example, as shown in FIG. 3, a single rank x8 DIMM 204 has nine chips: one chip 300 to hold error correcting code check sums, and eight chips 302 for data. The chips are, for example, dynamic random access memory (DRAM) chips.

As a particular example, each DRAM chip is 256 MBytes and has 8 data bits. Thus, the eight data chips form a 64 bit-wide array. Further, each chip has 8 sub-arrays or banks 304, each of which is 32 MBytes.

In one example in which a current generation, industry standard x8 DIMM is utilized, the entire cache line resides on a single DIMM. Each cache line address accesses 64 bytes of data residing on eight of the DRAMs. As indicated above, the ninth DRAM holds 8 bytes of error correcting code check sums. With only a single DRAM holding error correcting code check sums, it is insufficient to correct for a full DRAM failure. If the storage associated with a DRAM failure is read, it will cause an uncorrectable error (UE), which often results in a system crash.

Closer inspection of FIG. 3 reveals that if a full DRAM fails or a bank on a DRAM fails, the address space for the word lines or cache lines accessed from memory are not isolated to the DRAM with the fault, but instead, spans all the DRAMs on the affected DIMM. In this example, a bank on a DRAM is associated with the same 32 MByte address space across all the DRAMs on the DIMM. Thus, it is not sufficient to just avoid using the 32 Megabytes associated with the failed bank on the one DRAM. In order to avoid using this memory space associated with the fault, by design one has to also avoid using the common address range spanning across all the DRAMs on the DIMM. That is, to avoid accessing the faulty bank, access to the same corresponding 32 Megabytes on each DRAM is to be avoided. Thus, the affected memory space that needs to be avoided grows by a factor of 8, since there are 8 DRAMs holding customer usable data or software. Therefore, there is 8 times 32 Megabytes or 256 Megabytes of the customer addressable memory space to avoid. Often there is interleaving across banks within the DRAM which increases the difficulty of isolating a fault to only the smallest number of affected addresses. However, even 256 Megabytes represent only a small fraction, just 0.34%, of the customer memory space.

Further, in this particular example, there is additional interleaving, which is to be taken into consideration. With interleaving, which in this example, is across 2 channels, memory access is alternated from one channel to another to improve performance. Because of the interleaving, the full containment region is across two ranks Further, even if the failure is only associated with a DRAM on one of the DIMMs, since the interleaving goes across both channels, additional memory space is affected.

In particular, due to memory interleaving, which is used to improve performance and more evenly distribute power consumption to help ensure more uniform heat dissipation, it is common for contiguous addresses of the memory space available to software and operating systems to map to noncontiguous addresses in lower level physical memory. In this example, interleaving across two DIMMs, 2-way interleaving, doubles the affected memory space, increasing it to 0.68% of the total memory space (75 GBytes) that would have to be avoided. Interleaving across four DIMMs, 4-way interleaving, increases the effect to 1.36%; and across eight DIMMs increases it to 2.7%. Still, this remains a relatively small portion of the total available memory space.

In accordance with an aspect of the present invention, to mitigate a memory fault, memory is allocated in such a manner that a minimal number of processing entities is affected by a fault. To facilitate this, a physical affinity zone (PAZ) is introduced. A PAZ is the smallest area of a contiguous address space (e.g., contiguous virtual address space) that maps to a fault isolatable section of physical memory. The number of PAZ's and the size of a PAZ are directly related to how the system is configured. For example, if addresses on a DRAM are not interleaved between DRAM banks, then some significant DRAM faults can be isolated to a bank.

In one particular example, referring to FIG. 3, mapping from a single DRAM failure back to the smallest or minimally expansive area of contiguous addresses includes considering the strip of data accessed from all the DRAMs in the rank associated with the faulty DRAM bank. It does not require adding in any additional addresses when calculating the PAZ. In this example, a DRAM bank is associated with 32 MBytes of addresses. However, if memory channel interleaving is enabled, then the PAZ multiplies in size. For example, 2-way interleaving doubles the size; 4-way interleaving quadruples it; etc. . . . . In addition, if there is DRAM bank interleaving being utilized, the PAZ size is multiplied by a factor of 8 and encompasses the entire bank.

In any case, the PAZ size is a function of the specific machine operational design and configuration choices. Calculating the precise PAZ size and the contiguous address mapping for specific systems can be simplified by determining it in advance for various supported configurations so that a simple table look up can be utilized during recovery operations to speed the process. One example of such a table is depicted in FIG. 4.

Referring to FIG. 4, in this example, a first column 400 includes one or more PAZ, which, in this example, maps to each DRAM rank; a second column 402 includes a starting address (e.g., virtual) for the PAZ indicated in its row; a third column 404 includes an ending address (e.g., virtual) for the PAZ, the starting and ending address creating an address range; a fourth column 406 reflects a hierarchical PAZ structure; a fifth column 408 includes a power zone for the PAZ; a sixth column 410 includes a performance zone; and a seventh column 412 includes current state information. Further details pertaining to various of these columns are described below.

For instance, in the fourth column representing the hierarchy, it is shown that, in this example, eight DRAM banks map to a single DRAM rank. There may also be other possible configurations. Further, in another embodiment, the starting and ending addresses of the second level PAZ hierarchy are also included in the table to simplify table look up. Moreover, this hierarchical structure can be extended further to include DIMM level mapping, etc.

Next, referring to power management column 408, power management is performed at a multi-DIMM level including all the memory channels in which interleaving is occurring. If all memory usage could be halted across the expanse of physical memory, then it could theoretically be powered off temporarily to save power. To facilitate power management, PAZs are associated with a power zone. For instance, PAZs 0-9 are associated with power zone 0. Other examples are also possible.

Further, in this example, performance management (column 410) is performed across rank and memory channels in each interleaving section. Similar to power zones, PAZs are associated with performance zones. For instance, PAZs 0-8 are associated with performance zone 0. Other examples are also possible. By associating PAZs with different zones, memory allocation may be tailored to different needs (e.g., based on availability, reliability, etc.).

In one embodiment, this table is used with one or more address translation tables (e.g., page tables) to help manage virtual storage allocation. For example, the table might indicate (e.g., in the status column) that a PAZ is associated with a correctable error over threshold event, and thus, pages are reclaimed as they free up and use of those pages is avoided. It might also indicate a PAZ as a failed section that should not be used. It could indicate that a PAZ has been powered off. Other status is also possible. Further, to obtain updates for the table, an interface between system firmware and the operating system or hypervisor is utilized.

One embodiment of the logic associated with an initialization phase that determines physical affinity zones is described with reference to FIG. 5. In this example, an administrator (or in another embodiment, a processor for automatic initialization) is presented with a screen to guide the administrator in configuring the machine to provide higher availability. Options are provided, for instance, to reduce the PAZ size and/or to reserve memory capacity for memory fault recovery in order to avoid the need for DIMM replacement, when possible.

Once the initial configuration is completed, firmware calculates the number of PAZs available and contiguous addresses associated with each. This information is presented to the controller (e.g., operating system or hypervisor) for use in allocating memory (e.g., virtual memory) to specific applications, processes and/or virtual machine images.

Referring to FIG. 5, initially, a determination is made as to whether this is the first time the system is being booted or whether no previous configuration information file is found or whether a machine repair or upgrade is detected, INQUIRY 500. If the answer to any of the above inquiries is yes, then utilizing the memory configuration and one or more design parameters, such as number of DRAMs in a rank, number of ranks, DRAM type (x4 or x8), DRAM bank interleaving, and/or memory channel interleaving, each rank and DRAM bank is translated into physical affinity zones (e.g., virtual address physical affinity zones), STEP 502. For example, if the memory is 192 GB of 24 quad rank DIMMs, then there are 24 DIMMs, each with 4 ranks providing 96 (24×4) ranks Each rank could be associated with a PAZ, but since there is 2-way interleaving, 96 is divided by 2 providing 48 PAZ. Each PAZ is 4 GB, since $192 \geq 48 = 4$.

Thereafter, the processing allows for reconfiguration of the PAZs, STEP 504. This includes reviewing the created PAZs and determining whether any changes should be made to, for instance, the size and/or number of PAZs, based on, for instance, changes in interleaving and/or other configuration parameters to maximize for high availability. This may be done manually or programmatically based on pre-specified criteria.

Then, the physical affinity zones information is passed to the operating system or hypervisor (i.e., the controller), so that it can utilize it as a guide for allocating memory to minimize impact of failures. Where possible, applications and VM images are contained within one or a minimum number of physical affinity zones, STEP 506. The physical affinity zone information is then preserved, STEP 508, and processing is complete.

Returning to INQUIRY 500, if the answer to the inquiries is no, then the preserved physical affinity zone information is accessed, STEP 520, and the physical affinity zone information is updated based on any configuration changes, STEP 522. Thereafter, the physical affinity zone delta information is passed to the controller to utilize it as a guide for allocating memory to minimize impact of failures, STEP 524. Where possible, applications and VM images are contained within a physical affinity zone, STEP 524. The physical affinity zone information is then preserved, STEP 526, and processing is complete.

Figure 6A:
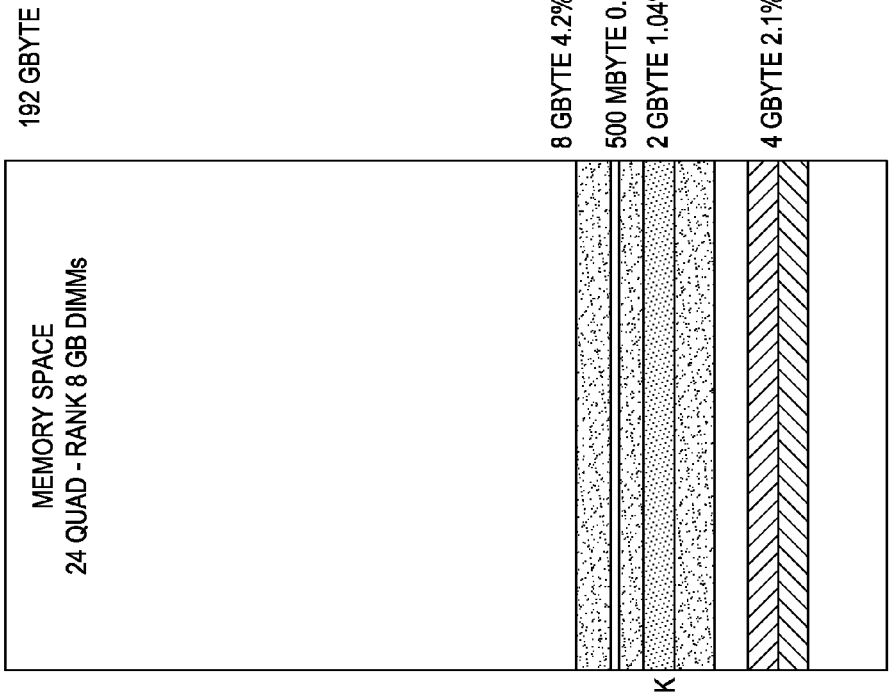
FIG. 6A depicts one example of memory allocation via physical affinity zones, in accordance with an aspect of the present invention.

A pictorial representation of memory allocation via physical affinity zones is depicted in FIG. 6A. As shown in FIG. 6A, a fault containment zone is carved out of 192 GB of 24 quad rank DIMMs with 8 memory channels with dual channel interleaving. As described above, this configuration results in 48 physical affinity zones, 4 GB each. Therefore, allocation of memory for a particular processing entity is contained within one PAZ, if possible, or a limited number of PAZs. For virtualized systems with a higher number of virtual images, high availability is achieved by allocating pages to a minimum number of PAZs for each virtual machine. Performance balance is maintained by restricting any single virtual machine to a single number of PAZs and then, spreading multiple VMs across PAZs across the memory space.

Figure 6B:
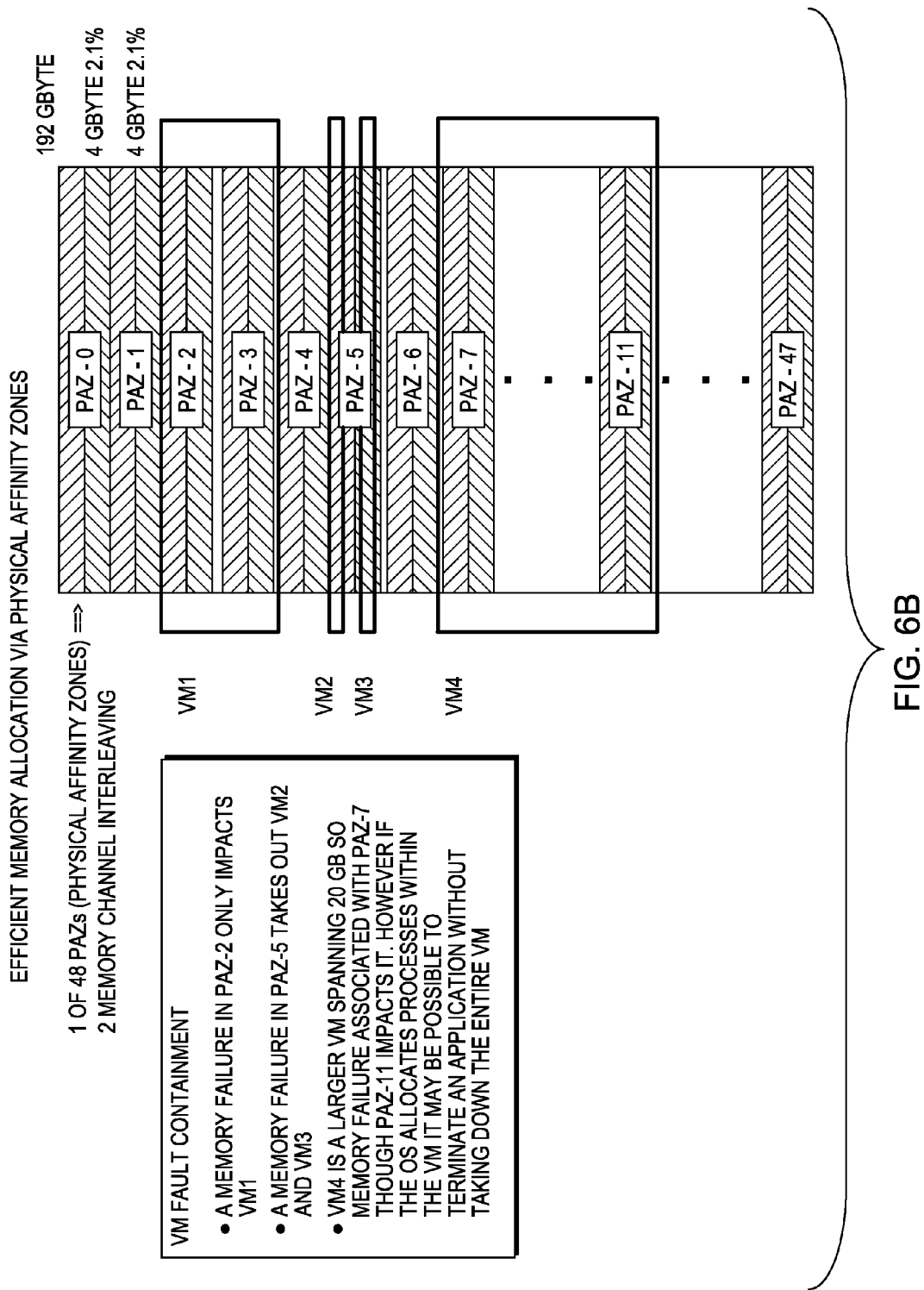
FIG. 6B depicts another example of memory allocation via physical affinity zones, in accordance with an aspect of the present invention.

With reference to FIG. 6B, it is shown how virtual machine fault containment is achieved. For example, memory failure in PAZ-2 only impacts VM1, since only VM1 has been allocated to PAZ-2. A memory failure in PAZ-5 takes out VM2 and VM3. VM4 is a larger VM spanning 20 GB, so memory failure associated with PAZ-7 though PAZ-11 impacts it. However, if the controller allocates processes within the VM it may be possible to terminate an application without taking down the entire VM.

By efficiently allocating memory (e.g., allocating memory such that the addresses assigned to a particular virtual machine or other processing entity are from one PAZ, if possible, or the least number of PAZs), effects of a memory fault are mitigated.

Figure 7:
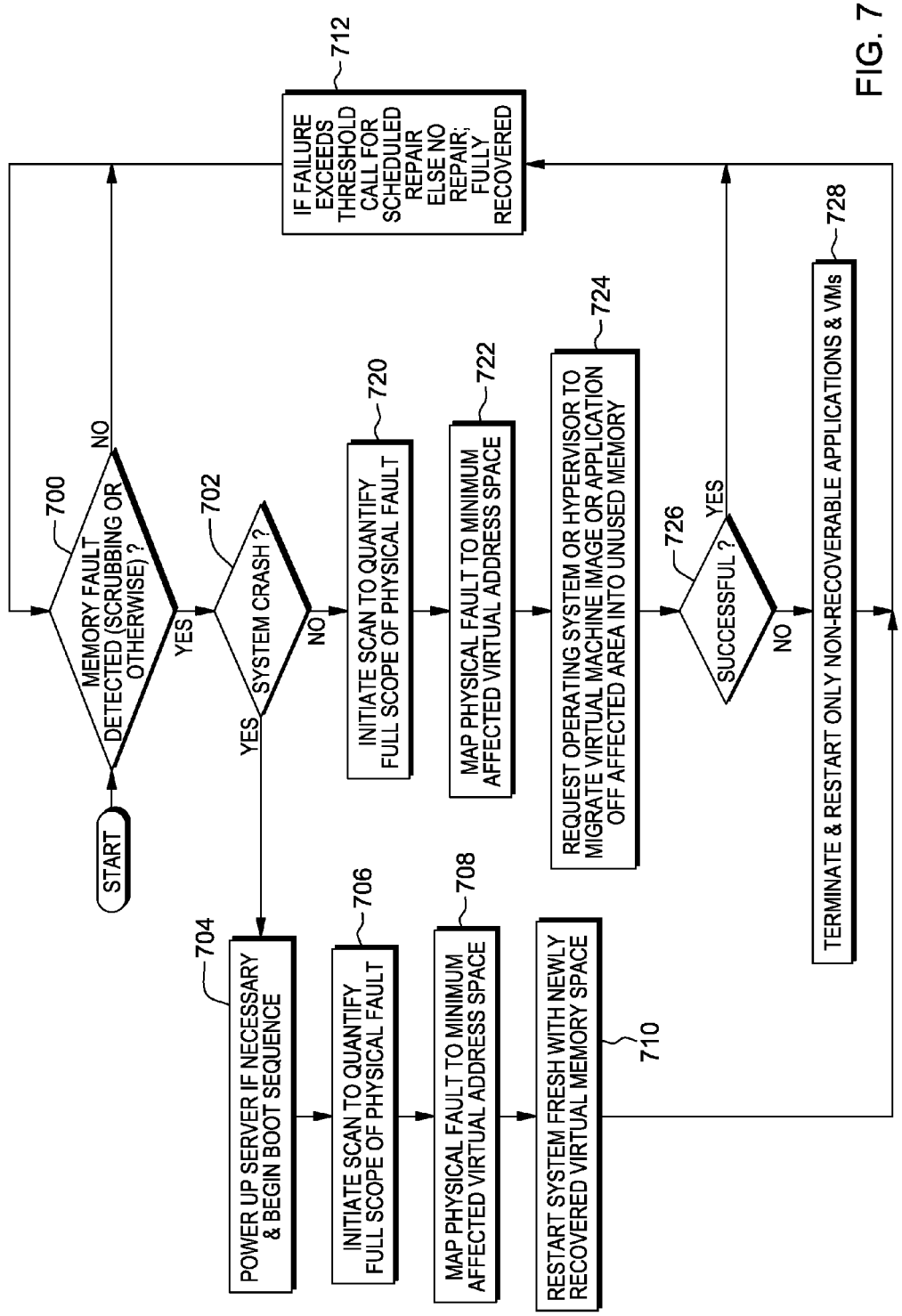
FIG. 7 depicts one embodiment of the logic associated with detecting and recovering from a memory fault, in accordance with an aspect of the present invention.

One example of detecting a memory fault and recovering therefrom, in accordance with an aspect of the present invention, is described with reference to FIG. 7. FIG. 7 depicts one example of a manifestation of physical memory fault mitigation via minimally expansive virtual memory pruning When a memory fault is detected via any mechanism, including scrubbing or software directly encountering the memory fault, the system can crash or the system may remain operational. In either case, the memory is scanned to determine the full extent of the physical memory space affected by the fault. The affected storage is then translated and mapped to the minimal memory space (e.g., virtual memory space) affected by the fault. If the system has crashed, then it is straight forward to reboot the software and applications into the remaining memory space absent the physical memory affected by the fault. If the server is able to survive the memory fault and is still operational, it first attempts to migrate the operational software, operating systems, virtual machine images and data off of the virtual storage affected by the memory fault. If completely successful, no other action is required. If not completely successful, it may be necessary to terminate the application or VM's and restart them in pristine areas of virtual memory not affected by the fault.

In one example, this logic is performed by firmware. As used herein, firmware includes, e.g., the microcode, millicode and/or macrocode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

Referring to FIG. 7, initially, a determination is made as to whether a memory fault has been detected by any mechanism, including scrubbing or software directly encountering the memory fault, INQUIRY 700. If a memory fault has not been detected, then this processing is complete and remains at INQUIRY 700. In one example, this inquiry is checked at predefined intervals.

However, if a memory fault has been detected, then the system may crash or the system may remain operational. If the system has crashed, INQUIRY 702, the server is powered up, if necessary, and its boot sequence is begun, STEP 704.

Thereafter, a scan is initiated to quantify the full scope of the physical fault, STEP 706. This includes, for instance, reading sequential memory addresses and keeping track of any faults. If there is a fault, for example, at each address when there is no interleaving or every other address for 2-way interleaving, etc., or a certain number of errors are detected, then it is determined a particular area of memory is faulty.

The physical fault is then mapped to a minimum affected address space, STEP 708. In one example, this address space includes is a virtual address space; however, in other examples, it may be other types of address spaces. For instance, the physical addresses of the faulty area are translated (e.g., using known address translation techniques and/or address translation tables) to virtual addresses. Then, using the virtual addresses, a look-up is performed in the PAZ table, which includes starting and ending virtual addresses for each PAZ, to determine the one or more PAZs that are affected by the fault.

Further, the system is restarted with the newly recovered virtual memory space, STEP 710, and if the failure has exceeded a threshold, a call is made to schedule a repair, or else no repair is needed and the system is fully recovered, STEP 712. Processing then proceeds to INQUIRY 700.

Returning to INQUIRY 702, if the system did not crash, then a scan is initiated to quantify the full scope of the physical fault, as described above, STEP 720, and the physical fault is mapped to the minimum affected virtual address space, STEP 722. A request is then made of the controller (e.g., operating system or hypervisor) to migrate the virtual machine image(s) or application(s) off of the affected area into unused memory, STEP 724. If this migration is successful, INQUIRY 726, then processing continues with STEP 712. Otherwise, the application and/or virtual machines are terminated, and the non-recoverable applications and/or virtual machines are restarted, STEP 728. Processing then proceeds to STEP 712.

Different types of faults may be detected and recovered from, in accordance with aspects of the present invention. Examples of this processing are described with reference to FIGS. 8-11.

Figure 8:
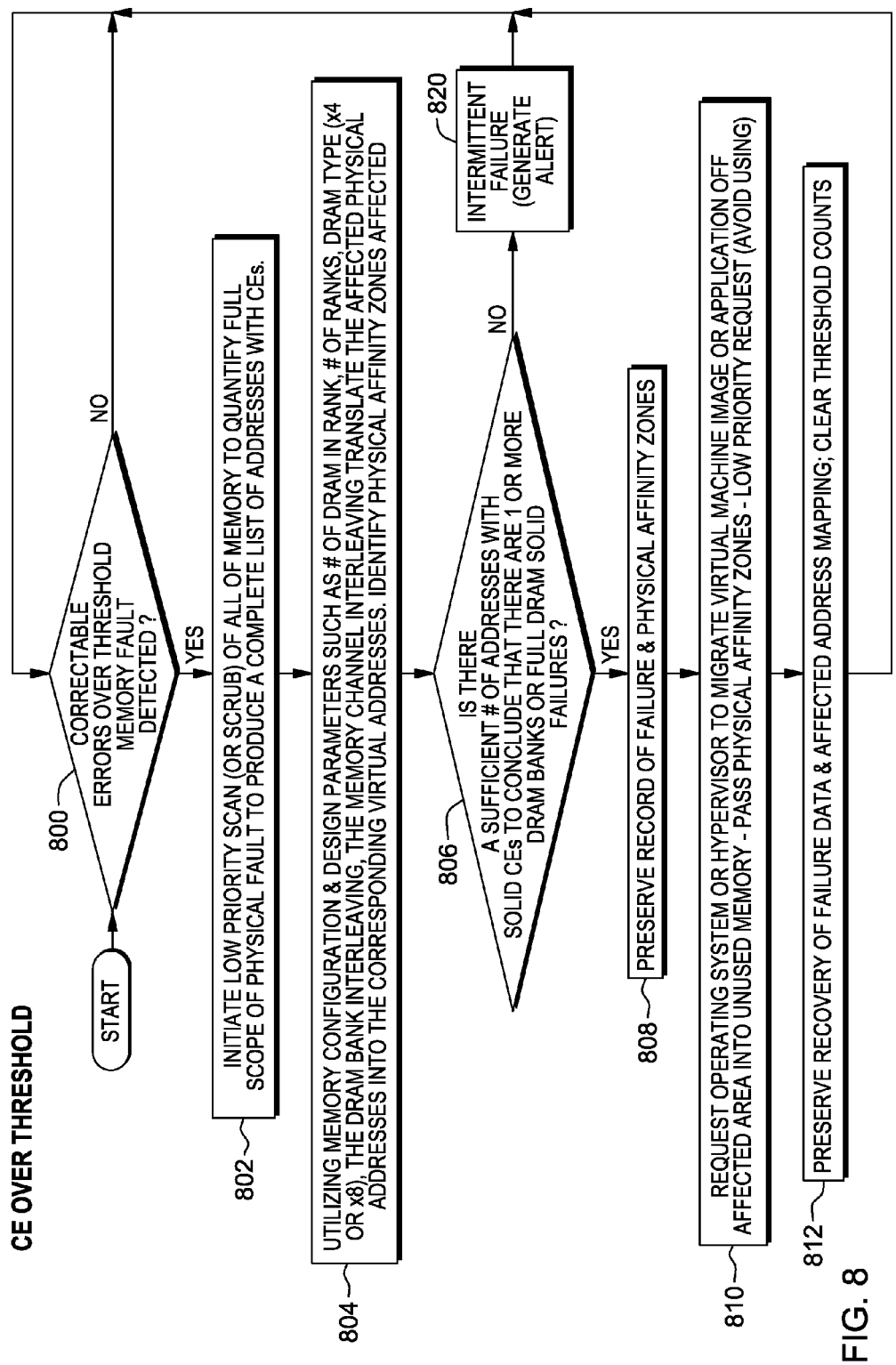
FIG. 8 depicts one embodiment of the logic associated with detecting and recovering from correctable errors over a threshold, in accordance with an aspect of the present invention.

Referring to FIG. 8, one embodiment of the logic for detecting and recovering from correctable errors over a threshold memory fault condition is described. Many servers have a correctable memory error threshold, so that if there is an excess of correctable memory errors detected over a specified period of time, a predictive failure alert (PFA) is generated to let the administrator know that an unusual, but recoverable, condition has occurred and that the associated DIMM (s) should be replaced at the next scheduled maintenance window. In this example, the one or more PAZs associated with the correctable error over threshold condition are determined, via, for instance, a low priority scan of memory (so as not to impact running applications). When the low priority scan is complete, it will either have detected that the fault is associated with one or more PAZs or that it cannot isolate the fault to a PAZ in which case it will generate an alert (or perhaps just a log entry) indicating that the fault condition appears to be intermittent.

Isolating to a PAZ can be challenging especially with memory being used by active software in which only reads may be possible. Some bit errors can be hidden by read-only scans because the stuck bit may be stuck in the correct value state for that particular stored word. That is one reason why memory diagnostics utilize bit patterns to verify memory is running properly. In any case, if there is a more substantial solid DRAM fault, a DQ failure, a DRAM bank failure, or a Full Chipkill it is recognized from the fault signature.

If the memory faults can be isolated to one or more PAZs, they are presented to the controller (e.g., operating system or hypervisor) for mitigation. The controller, in turn, determines if they are being used by active software. If a PAZ is not being used, the controller avoids using it or if there is reserved capacity memory configured, it stops using it all together. If the PAZ is being used, then the PAZ is marked so that as the memory frees up (low priority request), the controller avoids using it or if there is reserved capacity memory configured, stops using it altogether.

Referring to FIG. 8, this logic is performed by, for instance, the firmware. Initially, a determination is made as to whether correctable errors over a threshold memory fault have been detected, INQUIRY 800. If not, then this processing is complete remains at INQUIRY 800. In one example, this inquiry is checked at predefined intervals.

However, if the number of correctable errors has exceeded (or in another embodiment, is at) a predefined threshold, then a low priority scan or scrub of all of the memory is initiated to quantify the full scope of the physical fault. A complete list of physical addresses with correctable errors is produced, STEP 802.

Thereafter, utilizing memory configuration and design parameters, such as number of DRAMs in the rank, the number of ranks, DRAM type, DRAM bank interleaving, and memory channel interleaving, the affected physical addresses are translated into the corresponding virtual addresses, STEP 804. That is, utilizing the memory configuration and/or design parameters, one or more PAZs are created and contiguous addresses are assigned to each PAZ. Each of those contiguous addresses (e.g., virtual addresses) is associated, using known translation techniques, with a physical address assigned to a particular portion of memory represented by the PAZ. Thus, each PAZ has one or more contiguous addresses assigned thereto, and each contiguous address has a corresponding physical address. By assigning the contiguous addresses in this manner (i.e., to the PAZs), there is a tie-back to the addresses that would be impacted by different types of memory failures. The assigning of the contiguous addresses is not haphazard, but purposeful. The creation of the PAZs and the assigning of the contiguous addresses depends on the memory structure information, including, for instance, memory configuration, design parameters, and/or types of potential physical memory failures. Examples of potential physical memory failures include, for instance, a DRAM chip failure, bank failures, full DIMM failures, etc. Based on the type of failure and the physical structure of the memory (e.g., interleaving), a determination is made as to which physical addresses of memory would be affected by the fault, and PAZs are created and contiguous addresses are assigned based thereon. Thus, in this step, after obtaining the list of physical addresses, those addresses are translated using known techniques to their corresponding contiguous addresses, which were assigned based on the memory structure information. Then, using the contiguous addresses and the PAZ table, one or more affected PAZs are identified.

Next, a determination is made as to whether there is a sufficient number of addresses with solid correctable errors to conclude that there are one or more DRAM banks or full DRAM solid failures, INQUIRY 806. If so, then the record of failure and an indication of affected PAZs are preserved, STEP 808. Further, the controller is requested to migrate virtual machine images or applications off of affected areas into unused memory, STEP 810. The recovery of failure data and affected address mapping are preserved, and threshold counts are cleared, STEP 812. Processing then proceeds to INQUIRY 800.

Returning to INQUIRY 806, if there is not a sufficient number of addresses with solid correctable errors to conclude that there are one or more DRAM banks or full DRAM solid failures, then an alert is generated for an intermittent failure, STEP 820, and processing continues with INQUIRY 800.

Figure 9:
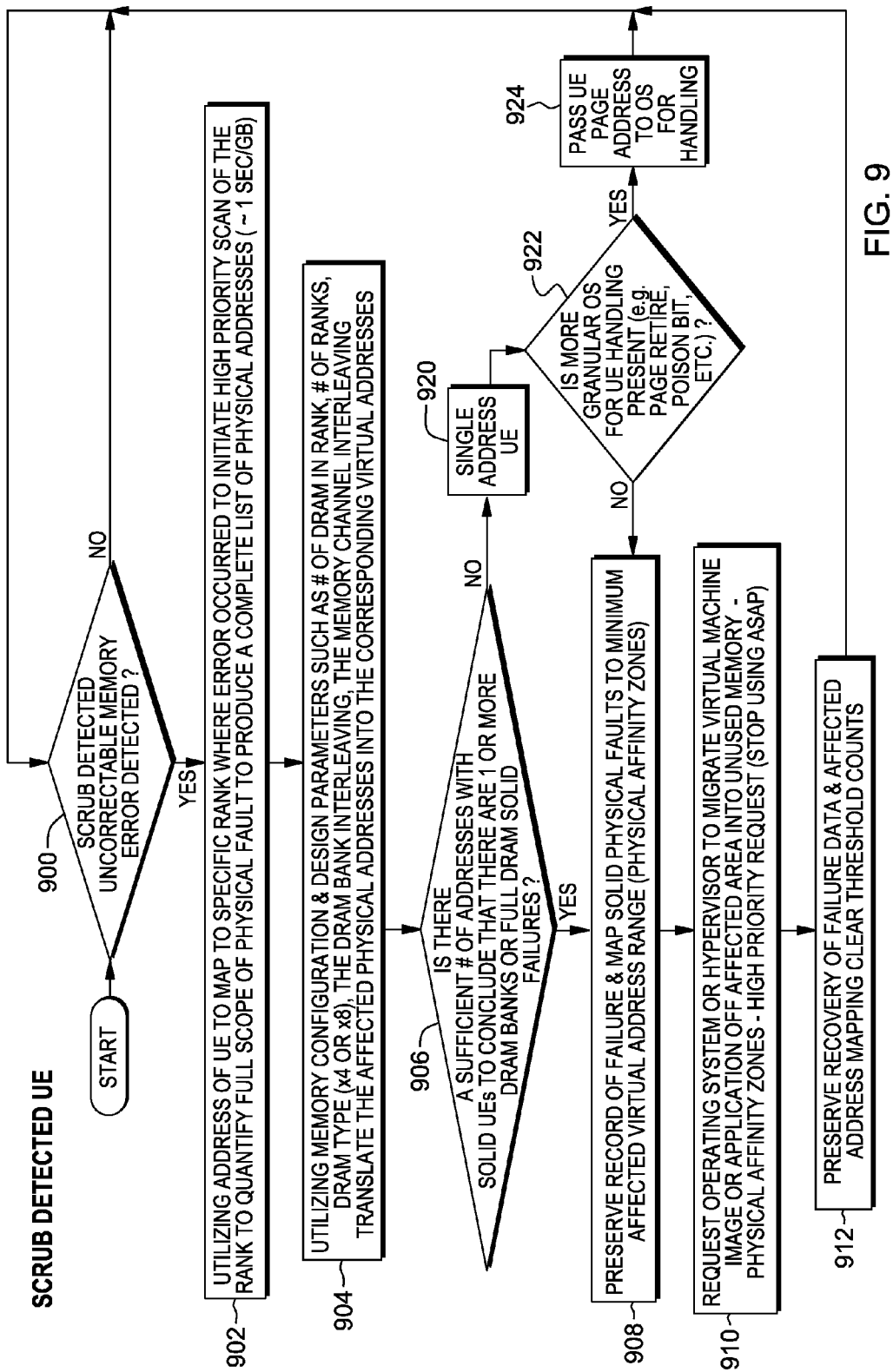
FIG. 9 depicts one embodiment of the logic associated with detecting and recovering from an uncorrectable memory error, in accordance with an aspect of the present invention.
Figure 11:
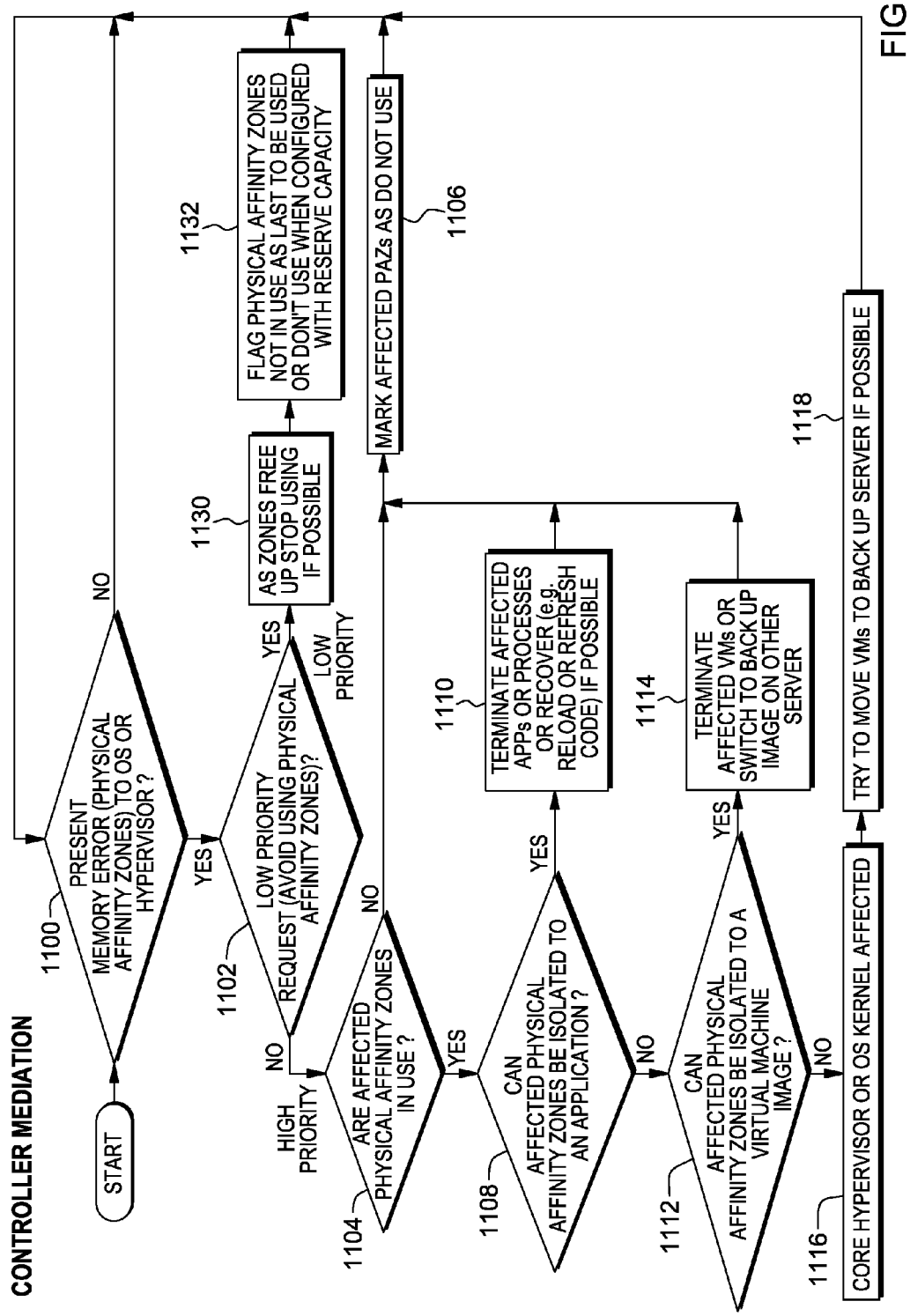
FIG. 11 depicts one embodiment of the logic associated with controller mediation, in accordance with an aspect of the present invention.

FIG. 9 depicts one embodiment of the logic for a scrub detected uncorrectable memory error. In this example, the address of the uncorrectable memory error is mapped to the PAZ associated therewith. A higher priority scan is kicked off to determine if there is a more extensive DRAM fault and another uncorrectable memory error associated with the PAZ in question. If there are, the PAZ will be presented to the controller (e.g., operating system or hypervisor) and flagged for high priority mitigation. An example of controller mitigation is shown in FIG. 11 and will be described in detail below. If the uncorrectable memory error is associated with only a single address, then less intrusive memory mitigation functions, such as page retirement, can be utilized, if present.

Referring to FIG. 9, in one embodiment, this logic is performed by firmware. Initially, a determination is made as to whether a scrub detected uncorrectable memory error is detected, INQUIRY 900. If not, then processing is complete and remains at INQUIRY 900. In one example, this inquiry is tested at predefined intervals.

However, if there is a scrub detected uncorrectable memory error, then utilizing the address of the uncorrectable error, the specific rank where the error occurred is mapped to, and a high priority scan of the rank is initiated to quantify the full scope of the physical fault to produce a complete list of physical addresses, STEP 902. Further, utilizing the memory configuration and design parameters, such as number of DRAMs in rank, number of ranks, DRAM type, DRAM bank interleaving and/or the memory channel interleaving, the affected physical addresses are translated into the corresponding contiguous (e.g., virtual) addresses, as described above, STEP 904.

Thereafter, a determination is made as to whether there is a sufficient number of addresses with solid uncorrectable errors to conclude that there are one or more DRAM banks or full DRAM solid failures, INQUIRY 906. If there are one or more DRAM banks or full DRAM solid failures, then the record of failure is preserved, and a mapping is performed of the solid physical faults to the minimum affected address ranges (PAZs), STEP 908. The mapping includes, for instance, utilizing the virtual addresses in a search of the PAZ table for affected PAZs.

Additionally, the controller is requested to migrate virtual machine images or applications off of the affected area(s) into unused memory, STEP 910. This is, for instance, a high priority request in order to stop using the affected memory, as soon as possible. Further, the recovery of failure data and affected address mapping are preserved, and the threshold counts are cleared, STEP 912. Processing continues with INQUIRY 900.

Returning to INQUIRY 906, if there is not a sufficient number of addresses with solid uncorrectable errors to conclude that there are one or more DRAM banks or full DRAM solid failures, then there is a single address uncorrectable error, STEP 920. A determination is made as to whether there is a more granular operating system (more granular than the controller) for handling the uncorrectable error, INQUIRY 922. If not, then processing continues with STEP 908. Otherwise, the page address of the uncorrectable error is passed to the more granular operating system for handling, STEP 924, and processing continues with INQUIRY 900.

Figure 10:
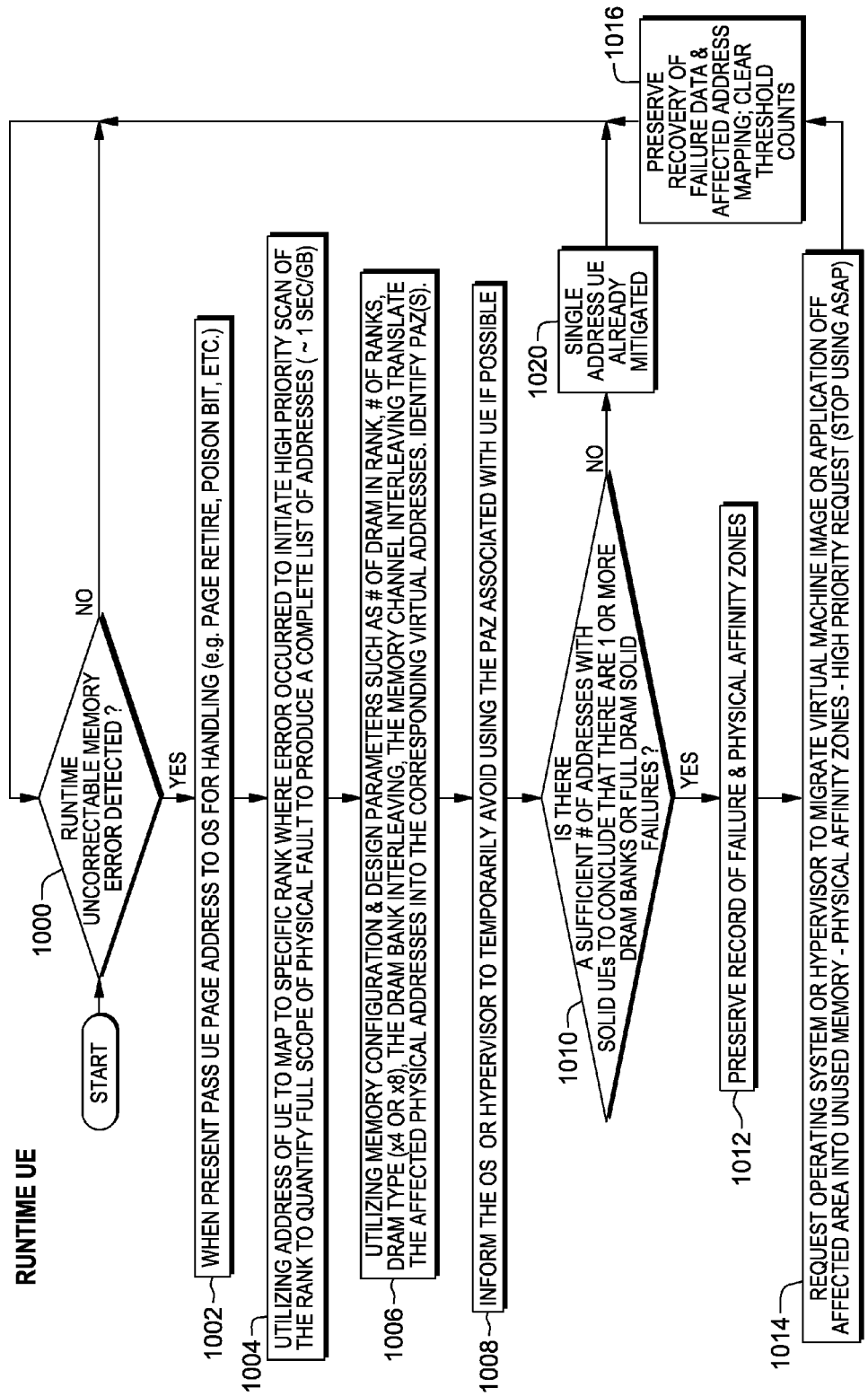
FIG. 10 depicts one embodiment of the logic associated with detecting and recovering from a runtime uncorrectable error, in accordance with an aspect of the present invention.

FIG. 10 shows one embodiment of a flow for a detected runtime uncorrectable memory error. In this example, there is a high degree of time sensitivity so as not to adversely impact the active software. If some form of page retirement is available, it is kicked off immediately because it may indeed be that this is an isolated uncorrectable memory error associated with a single page. In addition, the controller (e.g., operating system or hypervisor) is requested to try to temporarily avoid using the PAZ associated with the address of the uncorrectable memory error, if possible. In parallel, a higher priority scan is kicked off to determine if there are other uncorrectable memory errors associated with the PAZ in question. If there are multiple uncorrectable memory errors detected, the PAZ is presented to the controller and flagged for high priority mitigation. A back-of-the envelope calculation with typical DIMM speeds (e.g., 1333 MHz) indicates that a read-only scan of a 1 GB rank could be complete in a matter of seconds.

Referring to FIG. 10, in one embodiment, this logic is performed by firmware. In one example, a determination is made as to whether a runtime uncorrectable error is detected, INQUIRY 1000. If not, then this processing is complete and remains at INQUIRY 1000. In one example, this inquiry is tested at predefined intervals.

However, if an uncorrectable memory error is detected, then the page address of the uncorrectable error is passed to the operating system for handling (e.g., page retire, poison bit, etc.), STEP 1002. Further, the address of the uncorrectable error is used to map to the specific rank where the error occurred in order to initiate a high priority scan of the rank to quantify the full scope of the physical fault to produce a complete list of physical addresses, STEP 1004. Then, utilizing the memory configuration and design parameters (e.g., number of DRAMs in rank, number of ranks, DRAM type, DRAM bank interleaving and/or memory channel interleaving), the affected physical addresses are translated into corresponding contiguous addresses (e.g., virtual), as described above, STEP 1006. Further, using the virtual addresses, the PAZ table is searched for one or more affected PAZs.

Thereafter, the controller is informed to temporarily avoid using the PAZ(s) associated with the uncorrectable error(s), if possible, STEP 1008.

Additionally, a determination is made as to whether there is a sufficient number of addresses with solid uncorrectable errors to conclude that there are one or more DRAM banks or full DRAM solid failures, INQUIRY 1010. If so, then the record of failure and an indication of physical affinity zones are preserved, STEP 1012. The controller is requested to migrate virtual machine image(s) or application(s) off of the affected area into unused memory, STEP 1014. Further, the recovery of failure data and affected address mapping are preserved, and threshold counts are cleared, STEP 1016. Processing continues with INQUIRY 1000.

Returning to INQUIRY 1010, if there is not a sufficient number of addresses with solid uncorrectable errors to conclude that there are one or more DRAM banks or full DRAM solid failures, then there is a single address uncorrectable error that has already been mitigated in STEP 1002, STEP 1020, and processing continues with INQUIRY 1000. The mitigation in STEP 1002 is sufficient in and of itself.

As described above, in the various scenarios, the controller is informed of the fault so that it can take action. One embodiment of the logic for controller (e.g., operating system or hypervisor) mediation when a PAZ associated memory fault is presented is described with reference to FIG. 11. In this example, if the associated PAZs can be isolated, they are presented to the controller for a lower priority correctable memory error condition. The controller, in turn, determines if the PAZ is being used by active software. If the PAZ is not being used, the controller avoids using it or if there is reserved capacity memory configured, stops using it all together. If the PAZ is being used, the PAZ is marked so that as the memory frees up (low priority request), the operating system or hypervisor avoids using it, or if there is reserved capacity memory configured, stops using it all together.

For higher priority uncorrectable memory error type faults, the controller takes more immediate action. The controller, in turn, determines if the PAZ is being used by active software. If the PAZ is not being used, the controller flags it as do not use and stops using it all together. If the PAZ is being used, it attempts step-by-step the least intrusive and disruptive mitigation. It determines if the PAZ is associated with an application or process and recovers or terminates the application or process as necessary and automatically restarts it, if possible. If the PAZ can be isolated to a virtual machine image, it recovers or terminates the virtual machine image as necessary and automatically restarts it, if possible. If the PAZ is associated with more critical hypervisor or kernel operating system code, it does whatever it can to mitigate the failure (e.g., migrate or failover to a redundant image on a back-up server).

Referring to FIG. 11, in one example, initially, a determination is made as to whether a memory error is to be presented by the firmware to the controller (e.g., hypervisor or operating system), INQUIRY 1100. If not, then processing is complete and remains at INQUIRY 1100. In this example, this inquiry is tested at predefined intervals or may be immediate via a hardware interrupt to the firmware.

However, if the memory error is to be presented, e.g., by the firmware, to the controller, then the controller performs the remaining logic of FIG. 11. A determination is made, by the controller, as to whether it is a low priority request, INQUIRY 1102. If it is not a low priority request, but instead, a high priority request, a determination is made as to whether the affected physical affinity zones are in use, INQUIRY 1104. If they are not in use, then the affected PAZs are marked as do not use, STEP 1106, and processing proceeds to INQUIRY 1100. However, if the affected physical affinity zones are in use, a further determination is made as to whether the affected physical affinity zones can be isolated to an application, INQUIRY 1108. If so, then the affected applications or processes are stopped, and recovered (e.g., reload or refresh), if possible, in another part of memory unaffected by the fault, STEP 1110. In one example, they are moved to another area of memory unaffected by the fault. Further, the affected PAZs are marked as do not use, STEP 1106.

Returning to INQUIRY 1108, if the affected physical affinity zones cannot be isolated to an application, then a further determination is made as to whether the affected physical affinity zones can be isolated to a virtual machine image, INQUIRY 1112. If so, then the affected virtual machines are terminated or switched to a back-up image on another server, STEP 1114, and the affected PAZs are indicated as do not use, STEP 1106.

Returning to INQUIRY 1112, if the affected physical affinity zones cannot be isolated to a virtual machine image, then the core controller is affected, INQUIRY 1116. Thus, an attempt is made to move the virtual machines to a back-up server, if possible, STEP 1118, and processing continues with INQUIRY 1100.

Returning to INQUIRY 1102, if it is a low priority request, then as physical affinity zones free up, they are not used, STEP 1130. As long as there are one or more alternative PAZs unaffected by faults, they are used instead. Further, the physical affinity zones not in use are flagged as last to be used, or do not use when configured with reserved capacity, STEP 1132. As one example, for correctable errors over a threshold (lower priority), stop using the memory with the fault and move to other unaffected memory.

FIGS. 12A-12F show examples of the amount of contiguous memory visible to software that is retired using aspects of the present invention to mitigate various faults for various memory sizes and different choices of N-way memory channel interleaving across DIMMs. Initially, a smaller configuration is examined. In this configuration, each memory channel has 2 gigabyte DIMMs with a total of 8 channels for a total of 16 GB in the system. It would be common to interleave across the 4 channels of 8 GB of storage on each side to improve performance, but it would also be possible to interleave across 2 channels or disable interleaving altogether. Thus, examples are provided below of the impact aspects of the invention have on software usable memory space for these scenarios.

Referring to FIG. 12A, the percentage of software visible memory space that would have to be retired for a total of 16 GB of both x8 and x4 single rank 2 GB DIMMs is depicted. In this example, the system is configured with a single DIMM running on each of the 8 available memory channels. The highest percent of loss of usable memory space is with 4-way interleaving across 4 memory channels associated with each processor. If a full DRAM chip is lost or there is a DRAM with internal bank interleaving, there is a 12.8% loss in memory space that occurs. Although at first blush 12.8% might seem like a large amount of usable memory loss, if another technique was used that simply stopped using the DIMM where the fault resides, all 4 DIMM would have to be eliminated, since there is 4-way interleaving impacting 50% of the available storage. For systems with reduced interleaving or using x8 instead of x4 DRAM DIMMs, the usable memory space loss can be reduced well below 10% and failure of a bank on the DRAM worse case results in 1.6% loss of software usable memory space.

FIG. 12B illustrates the percentage of usable memory space lost when the memory size is increased by configuring with 3 DIMMs on all 8 memory channels each populated with 2 GB single rank DIMMs. In this case, the system has a total of 48 GB of usable memory space. As one might have anticipated, this is a 300% improvement in usable memory loss over the worse case scenario highlighted in FIG. 12A. A full DRAM chip failure, with maximum interleaving, with x4 DIMMs result in the loss of only 4.27% of memory space, ⅓ the loss that occurred with 16 GB. Again, by using x8 versus x4 DIMMs and reducing interleaving the amount of usable memory loss can be greatly reduced.

FIGS. 12C-12F are analogous to FIG. 12A, but with larger multi-rank DIMMs to obtain larger total memory space. Close examination of these figures reveals further improvement. One can readily see that the larger the DIMM size and the larger the total memory space, the smaller the percentage of customer usable memory space lost for different bank and DRAM failure scenarios. In general, the larger the memory space requires a greater number of DIMMs and this has a higher memory system failure rate. It is generally true that the probability of failure increases as the total memory size grows with all else equal.

One or more aspects of the invention are even more effective with larger memory configurations where the corresponding failure rate is proportionally higher. An aspect of the invention can be used to mitigate memory failure with a relatively small loss in customer usable memory space. The larger the memory space the smaller the percentage of loss in usable memory space.

For larger total memory size, the effectiveness of minimally expansive virtual memory pruning of one or more aspects of the present invention increases. Take for example, the 96 GB system in FIG. 12D. One could hold in reserve just 2.2% of the memory space and cover all the failures. In many cases, multiple memory failures can be handled without using up a 2.2% memory space reserve. Clearly, if 5% is held in reserve and considering normal projected typical failure rates for 4 GB DIMMs, most systems could be expected to survive failures encountered during their like time and not have to be taken down for a scheduled repair.

Described in detail above is a capability for mitigating the effects of a physical memory fault. The capability includes an allocation technique, as well as a recovery technique. By providing fault containment zone information (e.g., a memory allocation mapping guide in the form of PAZs) to the controller, the controller can allocate memory in such a way that impact of a memory fault is minimized. When a fault does occur, recovery includes relocating processing entities to areas of memory outside the affected fault containment zone (s). In one example, this is performed dynamically while the system is operating. Further, the affected zone(s) are avoided. This is accomplished without requiring changes to the memory characteristics, such as changes in N-way interleaving or other changes, allowing performance characteristics of the remaining memory after recovery to be unaltered.

On today's x86 virtualized servers, a single memory DIMM failure can result in a catastrophic impact. A single server may have 100 virtual machines (VMs), also called guest operating systems. Each VM may only use 4 GB of memory. Mapping a single VM to a single 4 GB DIMM would impact only one VM if the DIMM fails. But in today's systems, many or all of the VMs are terminated for single DRAM failures because the hypervisor does not do memory address mapping to minimize the impacts of a DRAM failure. x86 hypervisors do not get physical memory structure information to be able to intelligently assign addresses to VMs, even if they wanted to assign addresses to VMs to minimize the impact of a DRAM or DIMM failure.

In accordance with one or more aspects of the present invention, the impact of a DRAM or DIMM failure in a virtualized server is minimized. For example, at initialization, firmware provides the controller (e.g., hypervisor or operating system) with physical memory structure information to be used to minimize the impact of memory failures. The memory structure information identifies physical address ranges of physical DIMMs, DRAM structure (e.g., ranks), and/or if any interleaving (between DIMMs) is done. In one embodiment, the memory structure information includes an indication of one or more physical affinity zones from which memory is to be allocated. The one or more physical affinity zones are created based on the types of potential memory faults and the physical structure of the memory. The hypervisor or OS assigns VMs to the memory addresses associated with one or more PAZs. The allocation of pages within a PAZ by the hypervisor or OS is immaterial because mapping of memory addresses contained within the PAZ by the firmware is designed to minimize the number of VMs impacted by a memory failure.

In accordance with one or more aspects of the present invention, fault containment memory region information (e.g., PAZ information) is available to the controller during initialization for use in allocating memory, which ensures the fault has minimum impact on the VMs and applications; the minimum area of memory impact when failure occurs is communicated; a complete map is completed and utilized by the hypervisor; and firmware analyzes the fault signature and passes impacted fault zones to the controller for use in fault containment and recovery. In one embodiment, an interface, which may be standardized, may be created to provide PAZ information to the controller.

In one embodiment, responsive to completing physical memory fault mitigation via minimally expansive virtual memory pruning of one or more aspects of the present invention, a threshold can be used to determine if a scheduled repair is necessary. If the percentage of usable software accessible memory remains above the threshold, no further action is necessary. If the percentage of usable software accessible memory drops below some threshold, a scheduled repair is recommended to the customer. In other words, a threshold is used to determine if and when to initiate a service action.

Further, for any given failure rate, assuming a random independent failure mechanism, physical memory fault mitigation via minimally expansive virtual memory pruning has the potential to increase system availability by orders of magnitude. For example, take a DIMM with a mean time between failure (MTBF) of 300 DIMM-years which means that if 300 DIMM were run for a year on average one fail in that year is expected. If physical memory fault mitigation via minimally expansive virtual memory pruning allows survival of the first failure without exceeding threshold and requiring a scheduled repair action, then the mean time between failures (MTBF) for two DIMM failures goes from 300 DIMM-years to 90,000 DIMM-years.

Assuming a system is configured with 24 of these DIMMs, for a population of 24 DIMMs, the MTBF becomes 12.5 years. In other words, it is expected that a server configured with 24 DIMMs would see a DIMM failure on average every 12.5 years which well exceeds on average the expected useful life of most servers. In addition, if physical memory fault mitigation via minimally expansive virtual memory pruning allows survival of the first failure without exceeding threshold and requiring a scheduled repair action, then the MTBF for two DIMM failures goes to 326 years. So, most servers will never experience a double DIMM failure in their lifetime.

As a further example, assuming a very large server is configured with 100 of these DIMMs. For a population of 100 DIMMS, the MTBF becomes three years. In other words, it is expected that a server configured with 100 DIMMs will see a DIMM failure on average every three years, which is roughly the warranty period of many servers. It is expected that on average about 63% of the servers have one or more DIMM failures over the 100 DIMMs inside of a single MTBF period, assuming a simple model of constant failure rates. If physical memory fault mitigation via minimally expansive virtual memory pruning allows survival of the first failure without exceeding threshold and requiring a scheduled repair action, then the probability of getting two DIMM failures in the year goes to 18 years. Thus, most servers will never experience a double DIMM failure in their lifetime. However, since this is such a large memory configuration, it will likely be able to survive three or four failures without exceeding threshold. The MTBF of three DIMM failures is 167 years and four DIMM failures is 2066 years.

In one embodiment, improved availability is provided by avoidance of the need to make repairs due to having reserved memory.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electro-magnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 13:
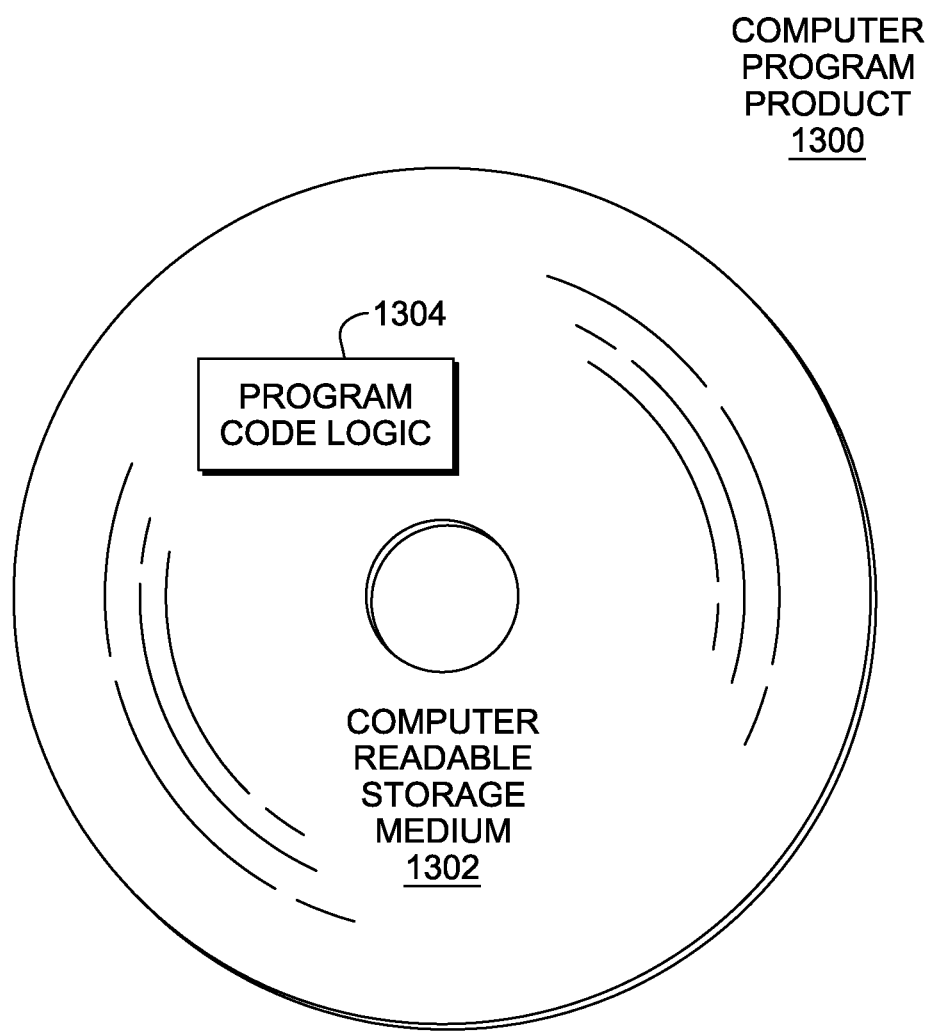
FIG. 13 depicts one embodiment of a computer program product incorporating one or more aspects of the present invention.

Referring now to FIG. 13, in one example, a computer program product 1300 includes, for instance, one or more non-transitory computer readable storage media 1302 to store computer readable program code means or logic 1304 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, different types of memory, and/or memory of different sizes and/or characteristics may benefit from one or more aspects of the present invention. Further, in another embodiment, the fault containment region may be more granular, such as the size of a memory bank. Yet further, the machine can be configured for other than or in addition to high availability, such as reliability or other characteristic(s).

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of one or more aspects of the invention. The embodiment was chosen and described in order to best explain the principles of aspects of the invention and the practical application, and to enable others of ordinary skill in the art to understand the invention for various embodiments with various modifications as are suited to the particular use contemplated.

What is claimed is:

1. A method of managing memory of a computing environment, said method comprising:
   obtaining, by a controller executing on a processor of the computing environment, memory structure information to be used in allocating memory to a plurality of processing entities of the computing environment, the memory structure information comprising:
      information relating to a plurality of address ranges provided based on memory structure and based on one or more types of potential physical memory failures corresponding to the memory structure; and
      an indication of one or more physical affinity zones of the memory, wherein each of the one or more physical affinity zones spans more than one physical memory channel and represents a smallest area of contiguous virtual address space in the memory that maps to a fault isolatable section of physical memory; and
   assigning, by the controller, based on at least a portion of the memory structure information, at least one address range of the plurality of address ranges to at least one processing entity of the plurality of processing entities, the assigning reducing an effect of a memory fault on the computing environment, wherein based on the allocating the memory fault is limited to a subset of processing entities of the plurality of processing entities, and wherein the memory fault is isolatable to a contiguous virtual address space.

2. The method of claim 1, wherein the memory structure information comprises information relating to the memory structure and an indication of interleaving for the memory.

3. The method of claim 2, wherein the information relating to the memory structure includes an indication of a number of ranks.

4. The method of claim 1, wherein each of the one or more physical affinity zones includes an address range of the plurality of address ranges; and
the assigning comprises using the indication of the one or more physical affinity zones to assign one or more address ranges to a processing entity of the at least one processing entity, wherein the processing entity is assigned addresses of one physical affinity zone or a least number of physical affinity zones.

5. The method of claim 4, further comprising:
determining the one or more physical affinity zones, wherein the determining utilizes at least one of a number of ranks in a memory module of the memory, a number of memory chips in a rank, a type of the memory module and an indication of interleaving to provide the one or more physical affinity zones; and
providing to the controller the indication of the one or more physical affinity zones, wherein the indication includes at least one of a number of physical affinity zones and a size of a physical affinity zone.

6. The method of claim 5, further comprising storing the indication of the one or more physical affinity zones for subsequent retrieval.

7. The method of claim 1, wherein the plurality of processing entities comprise at least one of a plurality of operating systems, a plurality of virtual machines, or a plurality of applications, and the controller comprises at least one of a hypervisor or an operating system.

8. The method of claim 1, further comprising:
obtaining, by the controller, an indication of the memory fault, including an indication of one or more physical affinity zones affected by the memory fault, wherein a physical affinity zone of the one or more physical affinity zones includes an address range of the plurality of address ranges;
determining, by the controller, a scope of failure related to the one or more physical affinity zones; and
performing one or more recovery actions based on the scope of failure.

9. The method of claim 8, wherein the performing one or more recovery actions comprises moving the subset of processing entities to memory unaffected by the memory fault.

10. The method of claim 8, further comprising:
detecting that the memory fault has occurred;
determining the one or more physical affinity zones affected by the memory fault; and
providing the indication of the memory fault to the controller.

11. A computer system for managing memory of a computing environment, said computer system comprising:
a memory; and
a processor in communications with the memory, wherein the computer system is configured to perform a method, said method comprising:
obtaining, by a controller executing on a processor of the computing environment, memory structure information to be used in allocating memory to a plurality of processing entities of the computing environment, the memory structure information comprising:
information relating to a plurality of address ranges provided based on memory structure and based on one or more types of potential physical memory failures corresponding to the memory structure, and
an indication of one or more physical affinity zones of the memory, wherein each of the one or more physical affinity zones spans more than one physical memory channel and represents a smallest area of contiguous virtual address space in the memory that maps to a fault isolatable section of physical memory; and
assigning, by the controller, based on at least a portion of the memory structure information, at least one address range of the plurality of address ranges to at least one processing entity of the plurality of processing entities, the assigning reducing an effect of a memory fault on the computing environment, wherein based on the allocating the memory fault is limited to a subset of processing entities of the plurality of processing entities, and wherein the memory fault is isolatable to a contiguous virtual address space.

12. The computer system of claim 11, wherein the memory structure information comprises information relating to the memory structure and an indication of interleaving for the memory.

13. The computer system of claim 11, wherein each of the one or more physical affinity zones includes an address range of the plurality of address ranges; and
the assigning comprises using the indication of the one or more physical affinity zones to assign one or more address ranges to a processing entity of the at least one processing entity, wherein the processing entity is assigned addresses of one physical affinity zone or a least number of physical affinity zones.

14. The computer system of claim 13, wherein the method further comprises:
determining the one or more physical affinity zones, wherein the determining utilizes at least one of a number of ranks in a memory module of the memory, a number of memory chips in a rank, a type of the memory module and an indication of interleaving to provide the one or more physical affinity zones; and
providing to the controller the indication of the one or more physical affinity zones, wherein the indication includes at least one of a number of physical affinity zones and a size of a physical affinity zone.

15. The computer system of claim 11, wherein the method further comprises:
obtaining, by the controller, an indication of the memory fault, including an indication of one or more physical affinity zones affected by the memory fault, wherein a physical affinity zone of the one or more physical affinity zones includes an address range of the plurality of address ranges;
determining, by the controller, a scope of failure related to the one or more physical affinity zones; and
performing one or more recovery actions based on the scope of failure.

16. A computer program product for managing memory of a computing environment, said computer program product comprising:
a computer readable storage medium readable by a processing circuit and storing instructions for execution by the processing circuit for performing a method comprising:
obtaining, by a controller executing on a processor of the computing environment, memory structure information to be used in allocating memory to a plurality of processing entities of the computing environment, the memory structure information comprising:
  information relating to a plurality of address ranges provided based on memory structure and based on one or more types of potential physical memory failures corresponding to the memory structure, and
  an indication of one or more physical affinity zones of the memory, wherein each of the one or more physical affinity zones spans more than one physical memory channel and represents a smallest area of contiguous virtual address space in the memory that maps to a fault isolatable section of physical memory; and
  assigning, by the controller, based on at least a portion of the memory structure information, at least one address range of the plurality of address ranges to at least one processing entity of the plurality of processing entities, the assigning reducing an effect of a memory fault on the computing environment, wherein based on the allocating the memory fault is limited to a subset of processing entities of the plurality of processing entities, and wherein the memory fault is isolatable to a contiguous virtual address space.

17. The computer program product of claim 16, wherein the memory structure information includes an indication of one or more physical affinity zones of the memory, wherein a physical affinity zone includes an address range of the plurality of address ranges; and the assigning comprises using the indication of the one or more physical affinity zones to assign one or more address ranges to a processing entity of the at least one processing entity, wherein the processing entity is assigned addresses of one physical affinity zone or a least number of physical affinity zones.

18. The computer program product of claim 17, wherein the method further comprises:
  determining the one or more physical affinity zones, wherein the determining utilizes at least one of a number of ranks in a memory module of the memory, a number of memory chips in a rank, a type of the memory module and an indication of interleaving to provide the one or more physical affinity zones; and
  providing to the controller the indication of the one or more physical affinity zones, wherein the indication includes at least one of a number of physical affinity zones and a size of a physical affinity zone.

19. The computer program product of claim 16, wherein the method further comprises:
  obtaining, by the controller, an indication of the memory fault, including an indication of one or more physical affinity zones affected by the memory fault, wherein a physical affinity zone of the one or more physical affinity zones includes an address range of the plurality of address ranges;
  determining, by the controller, a scope of failure related to the one or more physical affinity zones; and
  performing one or more recovery actions based on the scope of failure.

* * * * *